(12) United States Patent
Tu et al.

(10) Patent No.: US 10,867,975 B2
(45) Date of Patent: Dec. 15, 2020

(54) INTERCONNECT STRUCTURES, PACKAGED SEMICONDUCTOR DEVICES, AND METHODS OF PACKAGING SEMICONDUCTOR DEVICES

(71) Applicant: Taiwan Semiconductor Manufacturing Company, Ltd., Hsinchu (TW)

(72) Inventors: Chia-Wei Tu, Chunan Town (TW); Yian-Liang Kuo, Hsinchu (TW); Yi-Sheng Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/418,244

(22) Filed: May 21, 2019

(65) Prior Publication Data
US 2019/0273071 A1 Sep. 5, 2019

Related U.S. Application Data

(62) Division of application No. 14/701,260, filed on Apr. 30, 2015, now Pat. No. 10,340,258.

(51) Int. Cl.
*H01L 25/10* (2006.01)
*H01L 25/00* (2006.01)
*H01L 23/00* (2006.01)

(52) U.S. Cl.
CPC ............ *H01L 25/105* (2013.01); *H01L 24/19* (2013.01); *H01L 24/20* (2013.01); *H01L 24/97* (2013.01); *H01L 25/50* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/1431* (2013.01); *H01L 2924/1434* (2013.01); *H01L 2924/15311* (2013.01); *H01L 2924/181* (2013.01)

(58) Field of Classification Search
CPC combination set(s) only.
See application file for complete search history.

(56) References Cited

U.S. PATENT DOCUMENTS

| | | | |
|---|---|---|---|
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |

(Continued)

*Primary Examiner* — Moin M Rahman
(74) *Attorney, Agent, or Firm* — Slater Matsil, LLP

(57) ABSTRACT

Interconnect structures, packaged semiconductor devices, and methods of packaging semiconductor devices are disclosed. In some embodiments, an interconnect structure includes a polymer material and a post passivation interconnect (PPI) pad disposed over the polymer material. A PPI line is disposed within an opening in the polymer material, the PPI line being coupled to the PPI pad.

20 Claims, 22 Drawing Sheets

(56) References Cited

U.S. PATENT DOCUMENTS

| | | | |
|---|---|---|---|
| 8,183,579 B2 | 5/2012 | Wang | |
| 8,227,902 B2 | 7/2012 | Kuo | |
| 8,278,152 B2 | 10/2012 | Liu et al. | |
| 8,361,842 B2 | 1/2013 | Yu et al. | |
| 8,426,961 B2 | 4/2013 | Shih et al. | |
| 8,669,174 B2 | 3/2014 | Wu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,802,504 B1 | 8/2014 | Hou et al. | |
| 8,803,292 B2 | 8/2014 | Chen et al. | |
| 8,803,306 B1 | 8/2014 | Yu et al. | |
| 8,803,316 B2 | 8/2014 | Lin et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2009/0147196 A1* | 6/2009 | Horie | C08J 7/0427 349/122 |
| 2010/0072635 A1* | 3/2010 | Kuo | H01L 21/78 257/797 |
| 2011/0291288 A1 | 12/2011 | Wu et al. | |
| 2013/0001776 A1 | 1/2013 | Yu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0113097 A1 | 5/2013 | Yu et al. | |
| 2013/0168848 A1 | 7/2013 | Lin et al. | |
| 2013/0175685 A1* | 7/2013 | Wu | H01L 24/05 257/738 |
| 2013/0264684 A1 | 10/2013 | Yu et al. | |
| 2013/0307140 A1 | 11/2013 | Huang et al. | |
| 2013/0328190 A1 | 12/2013 | Wu et al. | |
| 2013/0341800 A1* | 12/2013 | Tu | H01L 23/585 257/774 |
| 2014/0001597 A1* | 1/2014 | Huang | H01L 23/5223 257/531 |
| 2014/0001645 A1 | 1/2014 | Lin et al. | |
| 2014/0015122 A1 | 1/2014 | Chou et al. | |
| 2014/0203429 A1 | 7/2014 | Yu et al. | |
| 2014/0225222 A1 | 8/2014 | Yu et al. | |
| 2014/0225258 A1 | 8/2014 | Chiu et al. | |
| 2014/0252558 A1* | 9/2014 | Yu | H01L 23/3192 257/618 |
| 2014/0252572 A1 | 9/2014 | Hou et al. | |
| 2014/0252646 A1 | 9/2014 | Hung et al. | |
| 2014/0264930 A1 | 9/2014 | Yu et al. | |
| 2015/0131247 A1* | 5/2015 | Nikitin | H01L 24/24 361/761 |

* cited by examiner

INTERCONNECT STRUCTURES, PACKAGED SEMICONDUCTOR DEVICES, AND METHODS OF PACKAGING SEMICONDUCTOR DEVICES

PRIORITY CLAIM AND CROSS-REFERENCE

This application is a divisional of U.S. patent application Ser. No. 14/701,260, entitled "Interconnect Structures, Packaged Semiconductor Devices, and Methods of Packaging Semiconductor Devices," filed on Apr. 30, 2015, which patent application is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packages for semiconductor devices that has been developed are wafer level packages (WLPs), in which integrated circuits are packaged in packages that typically include a redistribution layer (RDL) or post passivation interconnect (PPI) that is used to fan-out wiring for contact pads of the package so that electrical contacts may be made on a larger pitch than contact pads of the integrated circuit. WLPs are often used to package integrated circuits (ICs) that demand high speed, high density, and greater pin count, as examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
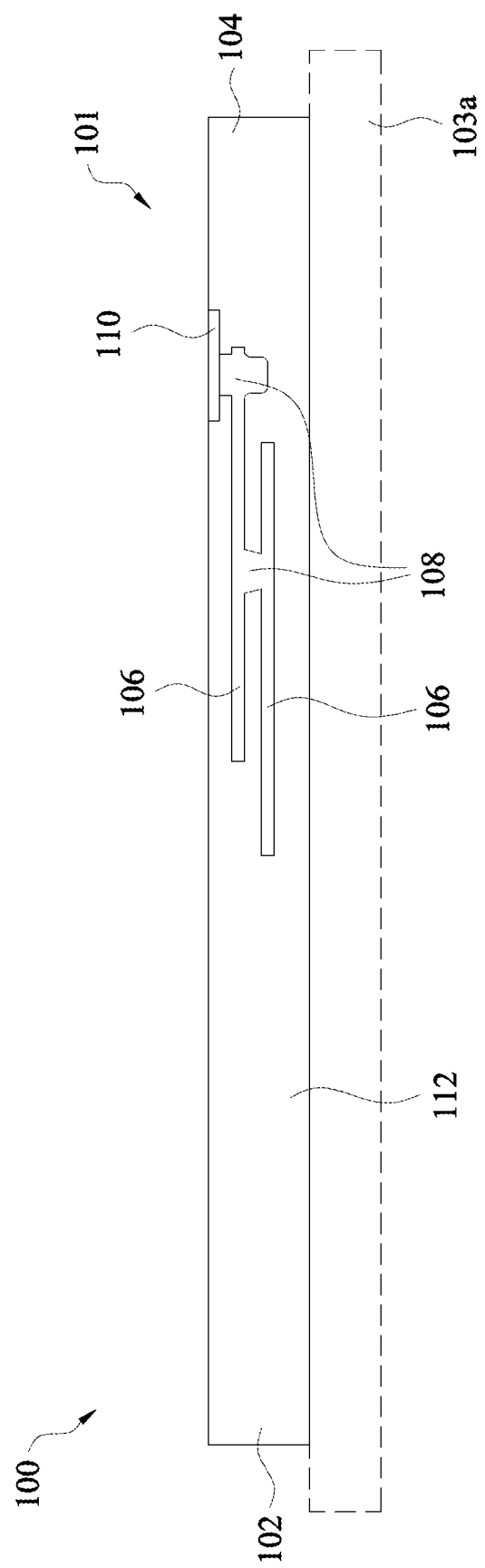
FIGS. 1 through 3, 5, 6, and 8 are cross-sectional views of a packaged semiconductor device at various stages that illustrate a method of packaging a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures, packaged semiconductor devices, and methods of packaging semiconductor devices are disclosed in the present disclosure. Packaging devices will be described herein that include a post-passivation interconnect (PPI) line that is formed in an opening in a polymer material, which improves reliability and prevents dendrite growth of conductive materials of an interconnect structure laterally through a more porous material such as a subsequently formed molding material, which dendrite growth can cause shorting and failures. Some embodiments will be disclosed that utilize a PPI line coupled to a PPI pad for the purpose of attaching one substrate to another substrate, wherein each substrate may be a die, wafer, printed circuit board, packaging substrate, or the like, thereby allowing for die-to-die, wafer-to-die, wafer-to-wafer, die or wafer to printed circuit board, packaging substrate types of packaging, or the like. Throughout the various views and illustrative embodiments, like reference numerals are used to designate like elements.

FIGS. 1 through 3, 5, 6, and 8 are cross-sectional views of a portion 100 of a packaged semiconductor device at various stages that illustrate a method of packaging a semiconductor device in accordance with some embodiments of the present disclosure. Referring first to FIG. 1, in some embodiments, a carrier 103a is provided, and an integrated circuit die 101 is coupled to the carrier 103a. The carrier 103a, shown in phantom (e.g., in dashed lines) in FIG. 1, comprises a wafer or other type of substrate that is used for the packaging process as a platform for packaging one or more integrated circuit dies 101. The carrier 103a is later removed after packaging a plurality of the integrated circuit dies 101 in some embodiments, for example.

The integrated circuit die 101 comprising a substrate 102 having electrical circuitry formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on the substrate 102, which typically comprises a silicon, other semiconductor material, or glass substrate. Other substrates, such as a multi-layered or gradient substrate may also be used.

The substrate 102 may include electrical circuitry formed thereon. The electrical circuitry may be any type of circuitry suitable for a particular application. In an embodiment, the electrical circuitry includes electrical devices formed on the substrate 102 with an insulating material 104 comprising one or more dielectric layers disposed in an upper region of the substrate 102 overlying the electrical devices. Metal layers may be formed within, on, and/or between the insulating material 104 to route electrical signals between the electrical devices, such as conductive lines 106 and vias 108 illustrated in FIG. 1. Electrical devices may be formed in one or more dielectric layers of the insulating material 104. As other examples, electrical circuitry formed within or on the substrate 102 may include various N-type metal-oxide semiconductor (NMOS) and/or P-type metal-oxide semiconductor (PMOS) devices, such as transistors, capacitors, resistors, diodes, photo-diodes, fuses, and the like, that are interconnected to perform one or more functions. The functions may include memory structures, logic structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

In some embodiments, the insulating material 104 or a portion thereof comprises an inter-layer dielectric (ILD) layer that may be formed, for example, of a low dielectric constant (low-K) dielectric material, such as phosphosilicate glass (PSG), borophosphosilicate glass (BPSG), fluorinated silicate glass (FSG), $SiO_xC_y$, spin-on-glass (SOG), spin-on-polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma CVD (HDPCVD), or the like. The insulating material 104 may comprise a plurality of dielectric layers in some embodiments.

Contact pads, such as contact pad 110 illustrated in FIG. 1, are formed within, on, and/or through the insulating material 104 to provide an electrical contact to electrical circuitry of the substrate 102. The contact pads 110 may be formed, for example, using photolithography techniques to deposit and pattern a photoresist material formed over the insulating material 104 to expose portions of the insulating material 104 that are to become the contact pads 110. An etch process, such as an anisotropic dry etch process, may be used to create openings in the insulating material 104. The openings may be lined with a diffusion barrier layer and/or an adhesion layer (not shown), and filled with a conductive material using a damascene process. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contact pads 110 illustrated in FIG. 1. The contact pads 110 may also be formed using a subtractive process, by depositing a conductive material over the insulating material 104, and patterning the conductive material using photolithography to form the contact pad(s) 110.

The insulating material 104 or a portion thereof may also comprise one or more inter-metal dielectric (IMD) layers that comprise the conductive lines 106 and vias 108. In some embodiments, the insulating material 104 comprises IMD layers disposed over an ILD layer. Generally, the insulating material 104 of the integrated circuit die 101 may include one or more IMD and/or ILD layers and associated metallization layers that are used to interconnect electrical circuitry of the substrate 102 to each other and also to provide external electrical connections for the integrated circuit die 101. In some embodiments, the contact pads 110 are provided in an uppermost IMD layer of the insulating material 104 to provide external electrical connections to the electrical circuitry of the substrate 102.

It should be noted that one or more etch stop layers (not shown) may be positioned between adjacent ones of the dielectric layers of the insulating material 104, for example, between the dielectric layers of the ILD layer and/or the IMD layers of the insulating material 104. Generally, the etch stop layers provide a mechanism to stop an etching process when forming vias 108 and/or contacts 106. The etch stop layers are formed of a dielectric material having a different etch selectivity to adjacent layers, such as the underlying semiconductor substrate 102 and overlying and underlying dielectric layers of the insulating material 104. In some embodiments, etch stop layers of the insulating material 104 may be formed of SiN, SiCN, SiCO, CN, combinations thereof, or the like, deposited by CVD, PECVD, or other methods.

Only two conductive line 106 layers and two conductive via 108 layers are shown within the insulating material 104 in the drawings; however, the insulating material 104 may comprise one or more conductive line 106 layers and one or more conductive via 108 layers in some embodiments.

In some embodiments, a passivation layer, not shown, may be formed over the insulating material 104. The passivation layer may be formed of a dielectric material, such as SiN, plasma-enhanced oxide (PEOX), plasma-enhanced SiN (PE-SiN), plasma-enhanced undoped silicate glass (PE-USG), or the like. The passivation layer is formed such that at least a portion of the contact pad 110 is exposed. The passivation layer may be formed by a blanket deposition and patterned using a photolithography process to provide an opening over the contact pad 110 and to protect the underlying layers from various environmental contaminants, for example. In some embodiments, a passivation layer is not included.

Figure 2:
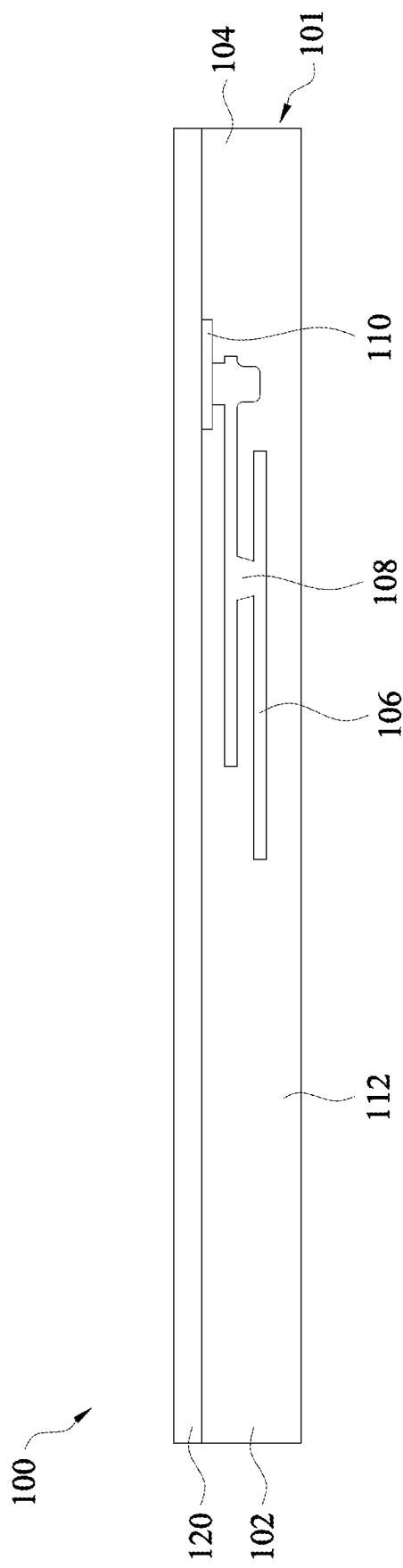

Referring next to FIG. 2, in accordance with some embodiments of the present disclosure, a polymer material 120 is formed over the substrate 102; e.g., over the insulating material 104 and the contact pad 110, or over the passivation layer and the contact pad 110, in embodiments wherein the passivation layer is included. The polymer material 120 may be formed of a polymer such as polybenzoxazole (PBO), polyimide (PI), epoxy, benzocyclobutene (BCB), molding compound, and the like, or a combination thereof. The polymer material 120 may comprise a thickness of about 3 μm to about 30 μm, for example. The thickness of the polymer material 120 may be greater than 30 μm in some embodiments. The formation methods for the polymer material 120 may include spin-coating, dispensing, thermal compression, CVD, PVD, or other methods, for example. A curing step may be performed to cure the polymer material 120. The polymer material 120 may also comprise other materials, dimensions, and formation methods.

The polymer material 120 is patterned using a lithography process, by forming a layer of photoresist (not shown) over the polymer material 120, and exposing the photoresist to energy reflected from or through a lithography mask (also not shown) having a desired pattern thereon. The photoresist is then developed, and exposed (or unexposed, depending on whether the photoresist comprises a positive or negative photoresist) portions of the photoresist are removed to form a patterned layer of photoresist. The patterned layer of photoresist is then used as an etch mask during an etch process for the polymer material 120. The layer of photoresist is then removed using an ashing and/or etch process.

Figure 3:
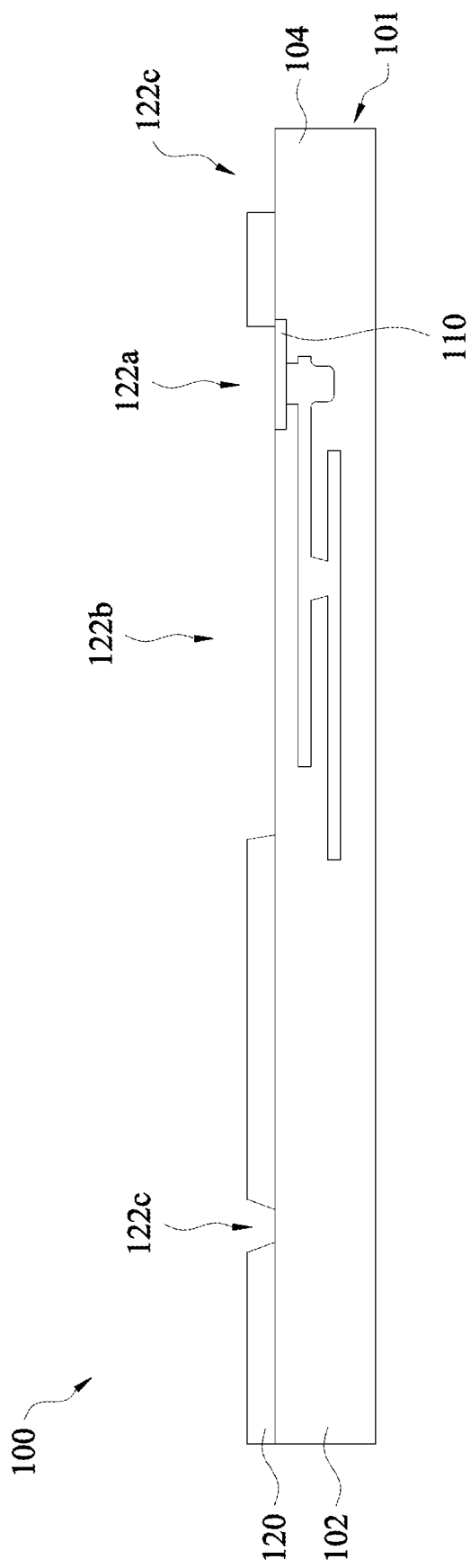
Figure 4:
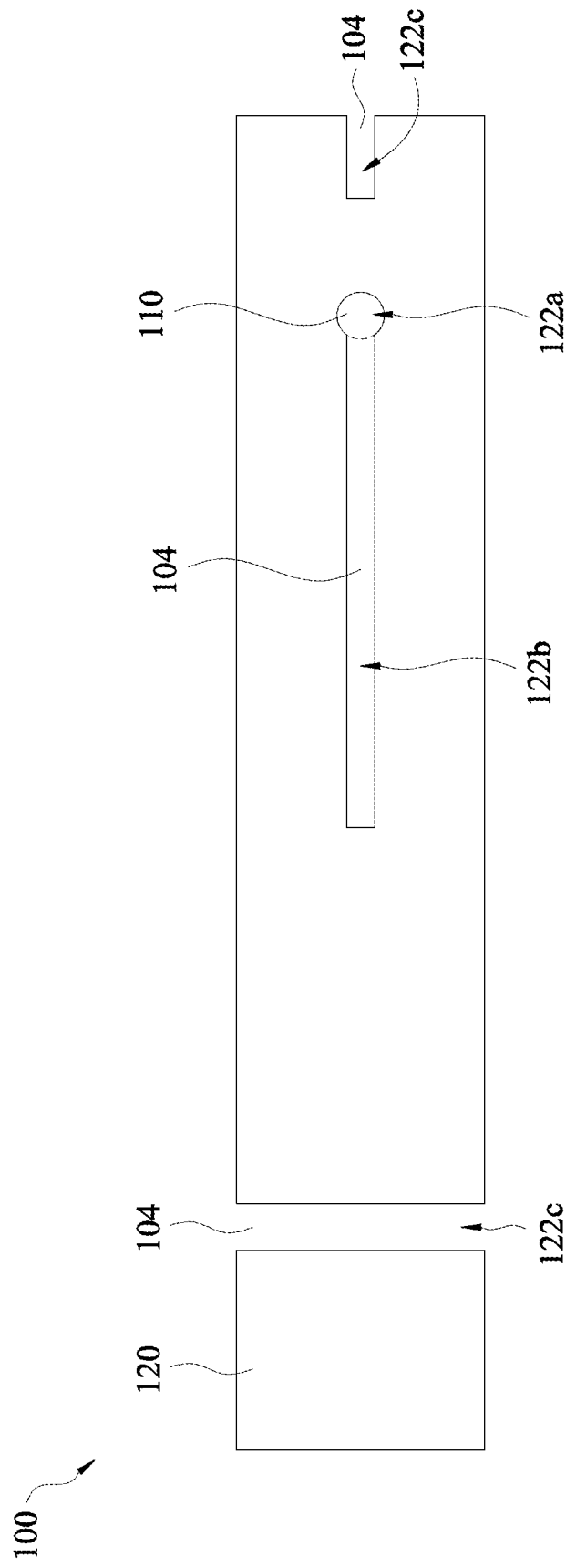
FIG. 4 shows a top view of FIG. 3 in accordance with some embodiments.

The patterned polymer material 120 is illustrated in a cross-sectional view in FIG. 3. FIG. 4 shows a top view of FIG. 3 in accordance with some embodiments. The patterned polymer material 120 includes openings 122a, 122b, and 122c formed therein. An opening 122a is formed over the contact pad 110 so that electrical connection may be made to the contact pad 110 by an interconnect structure 126 (see FIG. 6) such as a post-passivation interconnect (PPI). An opening 122b is also formed in the polymer material 120 where a PPI line 130 (see FIG. 6) will be formed. Openings 122c may also be formed for other PPI lines or conductive traces within the interconnect structure 126, for example. The opening 122b for the PPI line 130 comprises a region between the opening 122a over the contact pad 110 and a region disposed over the polymer material 120 wherein a PPI pad 128 (see FIG. 6) will be formed. The openings 122a and 122b are connected; for example, openings 122a and 122b comprise a single opening 122a/122b disposed over the contact pad 110 and a portion of the insulating material 104 of the substrate 102 of the integrated circuit die 101.

Figure 5:
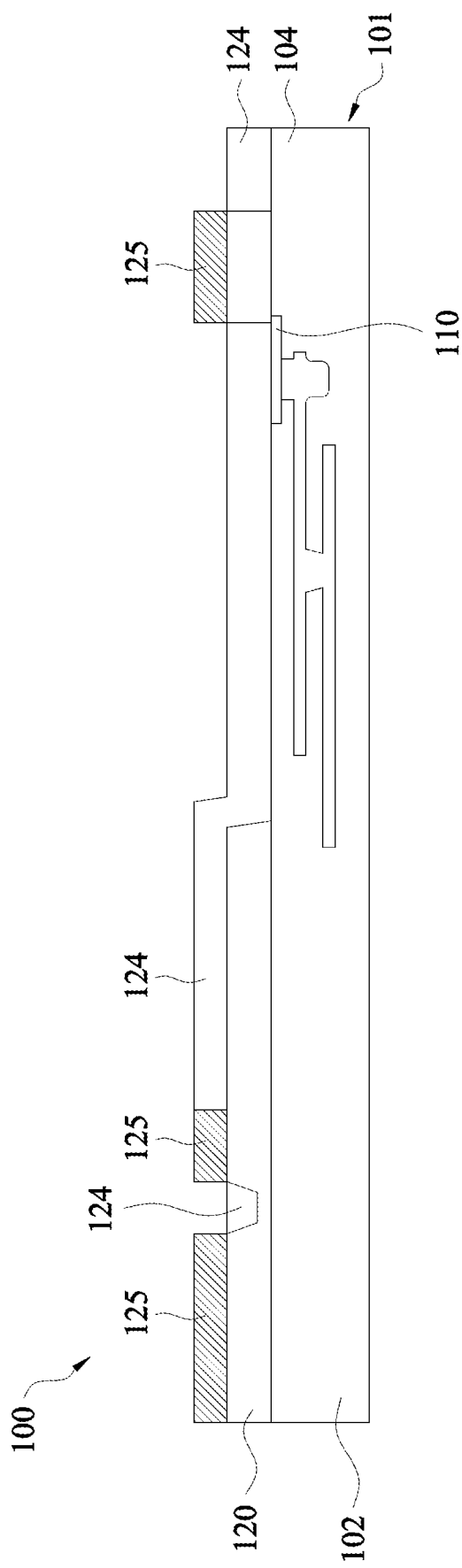
Figure 6:
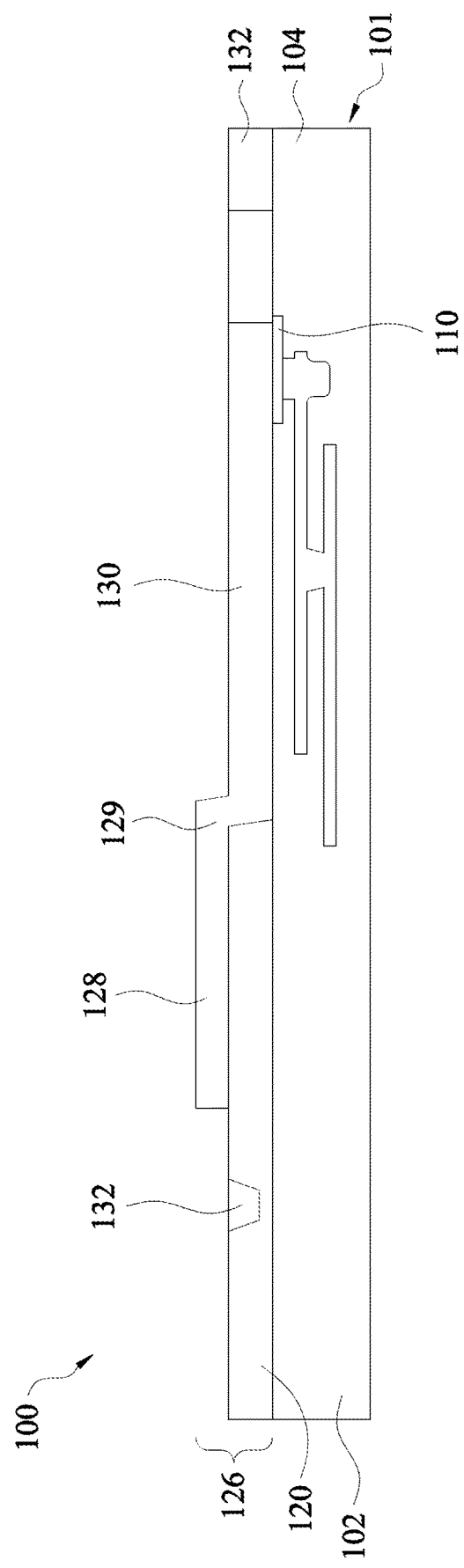
Figure 7:
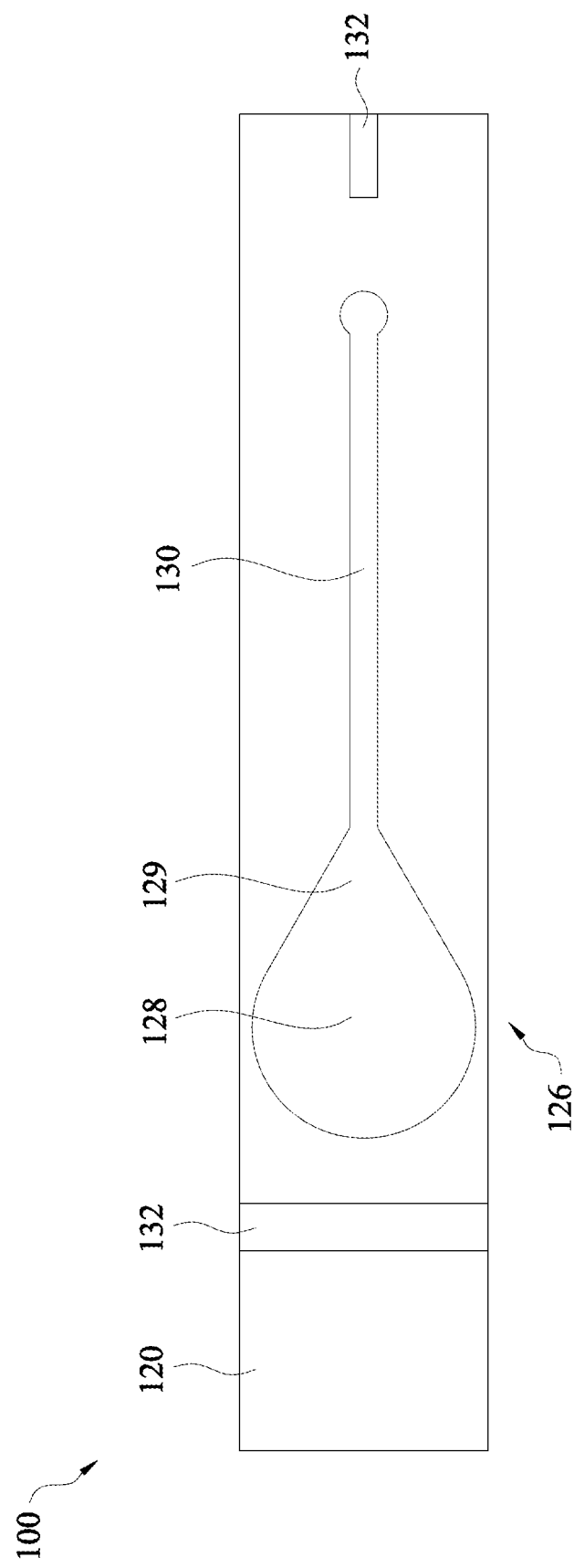
FIG. 7 shows a top view of FIG. 6 in accordance with some embodiments.

Next, an interconnect structure 126 is formed over the polymer material 120 and exposed portions of the integrated circuit die 101, as shown in FIGS. 5 through 7. The interconnect structure 126 comprises a redistribution layer (RDL) that provides electrical connections in a horizontal direction for the packaged semiconductor device in some embodiments, for example. To form the interconnect structure 126, a conductive material 124 is formed over the patterned polymer material 120, as shown in FIG. 5. The conductive material 124 comprises copper, a copper alloy, or other metals or conductive materials in some embodiments. The conductive material 124 may comprise a thin layer, e.g., comprising a thickness of about 2 μm to about 3 μm or less, of titanium or other seed material that is formed using a sputtering process, and a layer of copper, a copper alloy, or other metal that is electro-plated over the layer of titanium, in some embodiments. The overall thickness of the conductive material 124 comprises about 3 μm to about 30 μm, for example. In other embodiments, the conductive material 124 may be a multi-layered structure, such as a copper layer coated with electro-less nickel or electro-less palladium immersion gold (ENEPIG), which includes a nickel layer, a palladium layer on the nickel layer, and a gold layer on the palladium layer. The gold layer may be formed using immersion plating. The conductive material 124 may also comprise other materials, dimensions, and formation methods.

The conductive material 124 is formed using a plating process in some embodiments, as shown in FIGS. 5 and 6 in cross-sectional views and in a top view in FIG. 7. The conductive material 124 may be formed in some embodiments using a plating process, by forming a seed material (not shown) over the patterned polymer material 120, forming a masking material 125 such as a photoresist or other type of material over the seed material, patterning the masking material 125 using a lithography process, and plating a conductive material on the seed material through the patterned masking material, as shown in FIG. 5. The masking material 125 and remaining portions of the seed material are then removed, leaving the patterned conductive material 124, as shown in FIG. 6.

In other embodiments, the conductive material 124 may be patterned in some embodiments using a lithography process, similar to the lithography process described for the polymer material 120, using an etch chemistry suited for the conductive material 124. For example, the conductive material 124 may be formed as a blanket coating and then etched using a lithography process to pattern the conductive material 124.

The patterned conductive material 124 comprises an interconnect structure 126 that includes a PPI, RDL, or other type of interconnect structure. The interconnect structure 126 includes a PPI pad 128 disposed over the polymer material 120 that is coupled to the contact pad 110 of the integrated circuit die 101 by the PPI line 130 that is formed within the openings 122b and 122a (see FIGS. 3 and 4) in the polymer material 120. Portions of the patterned conductive material 124 disposed within the polymer material 120 fill the openings 122a and 122b in the polymer material 120 and form an electrical connection with the contact pad 110. The PPI pad 128 disposed over the polymer material 120 provides an electrical connection upon which an electrical connector, such as a solder ball or bump, may be placed. Other conductive traces or PPI lines 132 may also be formed during the patterning and formation process for the conductive material 124.

In some embodiments, the PPI pad 128 is coupled to the PPI line 130 by a transition element 129. The portion 100 of the packaging device includes the transition element 129 that is interposed between the PPI line 130 and the PPI pad 128. The PPI line 130, PPI pad 128, and transition element 129 are integral to one another and comprise a continuous portion of the conductive material 124 in some embodiments. Only one PPI line 130, PPI pad 128, and transition element 129 are shown in the drawings; however, a plurality of PPI lines 130, PPI pads 128, and transition elements 129 are formed across a surface of the packaging device and are used for making external electrical connections, as discussed in greater detail below with reference to FIG. 20. The PPI line 130, PPI pad 128, and transition element 129 comprise a redistribution layer (RDL) or other interconnect routing structure of the packaging device 100 in some embodiments, for example.

Generally, the PPI line 130 provides an electrical connection from a contact 110 of the integrated circuit die 101 to the PPI pad 128. The PPI pad 128 is an enlarged region disposed over the polymer material 120 that is designed to accommodate an external electrical connection by a connector 136 (see FIG. 8), such as a solder ball. The PPI pad 128 illustrated in FIG. 7 is circular, although other shapes may be used.

The transition element 129 is also disposed over the polymer material 120. The transition element 129 may comprise a shape adapted to reduce or prevent the material of the connector 136 from wetting onto the PPI line 130 in some embodiments. The transition element 129 has a tapered region extending from the PPI pad 128 having a substantially triangular shape with a curved side proximate the PPI pad 128 in the embodiments shown in FIG. 7. The transition element 129 may also comprise other shapes. In some embodiments, a transition element 129 is not included, and the PPI line 130 is coupled directly to the PPI pad 128, not shown in the drawings.

The interconnect structure 126 includes the PPI line 130, the PPI pad 128, and the transition element 129 interposed between the PPI line 130 and the PPI pad 128. The PPI line 130 may have a narrow, wide, or tapered shape. The PPI line 130 may comprise a substantially constant thickness and width. The PPI line 130 is shown as a straight line in FIG. 7: in some embodiments, the PPI line 130 may comprise a meandering shape. The PPI line 130 terminates at the transition element 129, and the transition element 129 terminates at the PPI pad 128; therefore, the bodies of the PPI line 130, transition element 129, and the PPI pad 128 may be formed as one piece. The PPI line 130 comprises a first end and a second end opposite the first end. The first end of the PPI line 130 is coupled to the PPI pad 128, and the second end of the PPI line 130 is coupled to the contact pad 110 of the integrated circuit die 101 in some embodiments.

Figure 8:
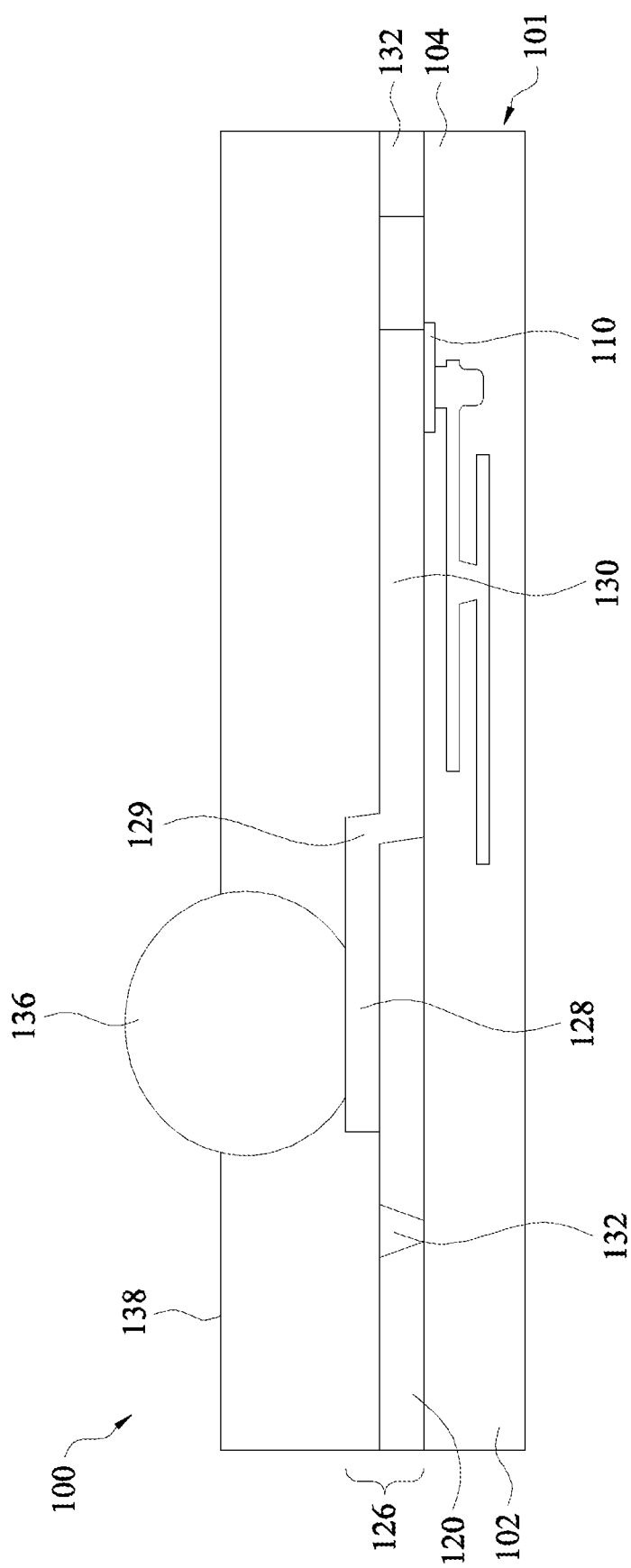

A connector 136 is then coupled to the PPI pad 128, as shown in FIG. 8. The PPI pad 128 is used to connect to the connector 136, forming a connection between the contact 110 to the connector 136 by way of the PPI line 130, the transition element 129, and the PPI pad 128. The connector 136 may have a larger diameter or smaller diameter than the diameter of the PPI pad 128.

In some embodiments, the connector 136 comprises a eutectic material and may comprise a solder bump or a solder ball, as examples. The use of the word "solder" herein includes both lead-based and lead-free solders, such as Pb—Sn compositions for lead-based solder; lead-free solders including InSb; tin, silver, and copper ("SAC") compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors 136 such as solder balls may be formed from SnCu compounds as well, without the use of silver (Ag). Alternatively, lead-free solder connectors may include tin and silver, Sn—Ag, without the use of copper. The connectors 136 may be one among an array of the connectors 136 as a grid, referred to as a "ball grid array" or "BGA". The connectors 136 may alternatively be arranged in other shapes. The connector 136 comprises a conductive ball having a shape of a partial sphere in some embodiments. Alternatively, the connector 136 may comprise other shapes. The connector 136 may also comprise a non-spherical conductive connector, for example.

The connector 136 is attached in some embodiments using a solder ball drop process. During the connector 136 mounting process, or after the connector 136 mounting process, the eutectic material of the connector 136 may be re-flowed, and a portion of the connector 136 flows over a portion of the transition element 129 in some embodiments, forming a wetting region (not shown) that extends away from the PPI pad 128 on a surface of the transition element 129. In some embodiments, the wetting region is formed over the entire transition element 129. In other embodiments, a wetting region is not formed.

In some embodiments, a material of the connector 136 comprises a eutectic material such as solder that is adapted to melt at a predetermined temperature, for example. The connector 136 may comprise a solder ball or solder bump in some embodiments, as examples. The connector 136 may also comprise other types of connection devices, such as conductive bumps, conductive balls, conductive pillars, non-spherical connectors, or other connectors. When the eutectic material of the connector 136 cools, the connector 136 may be used to electrically and mechanically couple a packaged semiconductor device to another device or object.

Figure 9:
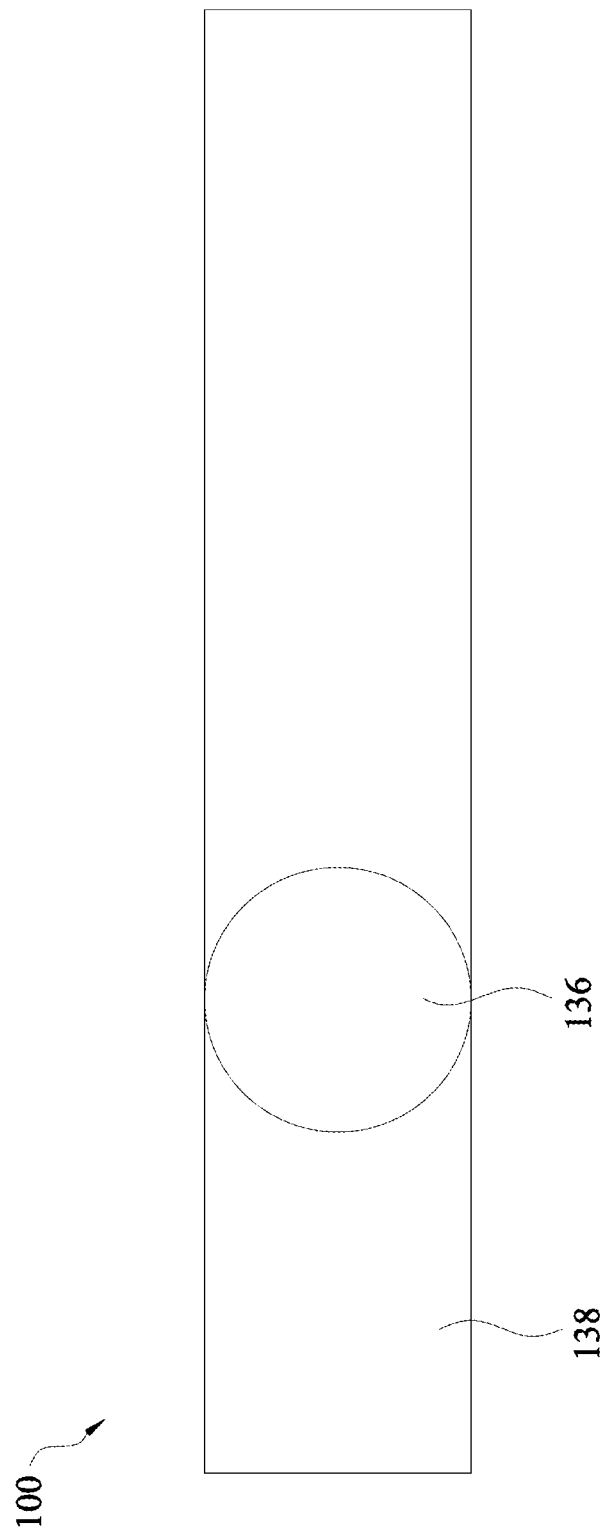
FIG. 9 shows a top view of FIG. 8 in accordance with some embodiments.

A molding material 138 is then formed over the PPI line 130, PPI pad 128, transition element 129, and exposed portions of the polymer material 120 around the connector 136 in some embodiments, also shown in FIG. 8 and in a top view in FIG. 9. A top portion of the molding material 138 may be recessed so that a top portion of the connector 136 is exposed. An amount of the molding material 138 applied may also be controlled so that the top portion of the connector 136 is exposed. A molding compound clamp may be applied during a curing process and a plasma treatment process of the molding material 138 in some embodiments, for example.

The molding material 138 comprises a molding compound comprised of an insulating material, such as an epoxy, a filler material, a stress release agent (SRA), an adhesion promoter, other materials, or combinations thereof, as examples. The molding material 138 comprises a liquid or gel when applied so that it flows between and around the connectors 136, in some embodiments. The molding material 138 is then cured or allowed to dry so that it forms a solid.

In some embodiments, the polymer material 120 comprises a first porosity, and the molding material 138 comprises a second porosity, wherein the second porosity is greater than the first porosity. The molding material 138 is more porous than the polymer material 120 in some embodiments, for example. Because the PPI line 130 is formed within the polymer material 120 that is less porous than the molding material 138, dendrite growth between the PPI line 130 to adjacent PPI lines 130 and/or 132 is reduced or eliminated, which advantageously reduces or prevents shorts to the adjacent PPI lines 130 and/or 132. During some reliability tests of a packaged semiconductor device, such as pressure cook tests (PCTs), for example, moisture absorption in the PCT environment can cause dendrite growth of conductive materials such as copper within and through a porous molding material, for example.

The process discussed above describes a two-mask process, in which two lithography masks are used to form the interconnect. For example, a first mask is used in some embodiments to form the openings 122a, 122b, and 122c in the polymer material 120 as shown in FIGS. 3 and 4, and a second mask is used to form the PPI line 130 and PPI pad 128, as shown in FIGS. 5, 6, and 7. In other embodiments, a three-mask process may be used, which utilizes another passivation and/or polymer layer over the PPI line and pad, which layer is patterned to form an opening to the PPI pad, or a four-mask process may utilize another mask to form an under-bump metallization layer. Embodiments such as those discussed herein are particularly useful in some embodiments in a two-mask process, but may also be used in other systems such as the three-mask, four-mask systems, or five or more mask systems.

In the embodiments illustrated in FIGS. 1 through 9, the openings 122a, 122b, and 122c are formed substantially in an entire thickness of the polymer material 120. For example, the polymer material 120 comprises a first thickness, and the PPI line 130 comprises a second thickness, wherein the second thickness is substantially the same as, or about the same as, the first thickness.

Figure 10:
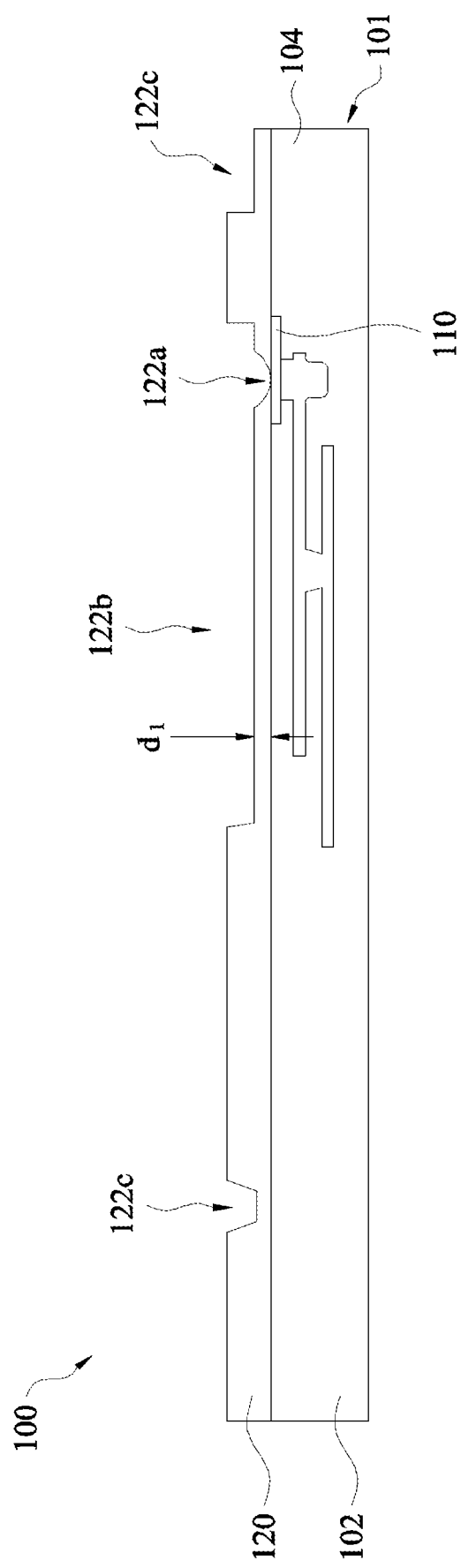
FIGS. 10 through 13 are cross-sectional views that illustrate a method of packaging a semiconductor device at various stages in accordance with some embodiments.

In other embodiments, the openings 122a, 122b, and 122c are formed partially in the polymer material 120 in an upper region of the polymer material 120, as shown in FIGS. 10 through 13, which are cross-sectional views that illustrate a method of packaging a semiconductor device at various stages in accordance with some embodiments. In FIG. 10, a portion 100 of a packaging device is shown after the packaging process step shown in FIG. 3, wherein an upper region of the polymer material 120 is removed during the etch process. The etch process may comprise a timed etch process, for example. An additional lithography step or a laser drilling process is used to form the opening 122a over the contact pad 110 within a lower region of the polymer material 120, wherein the lower region is disposed beneath the upper region of the polymer material 120 that was removed in the patterning step for the upper region of the polymer material 120. Thus, an additional lithography mask may or may not be used to form the deeper openings 122a over the contact pad 110. The thickness of the polymer material 120 in the openings 122b and 122c comprises a dimension $d_1$, wherein dimension $d_1$ comprises about 3 μm to about 20 μm in some embodiments. In other embodiments, about 50% to about 90% of the polymer material 120 is removed during the etch process used to form the openings 122b and 122c, as another example. The etch process used to remove the upper region of the polymer material 120 may also comprise other methods, and the remaining lower region of the polymer material 120 comprising dimension $d_1$ may also comprise other dimensions.

Figure 11:
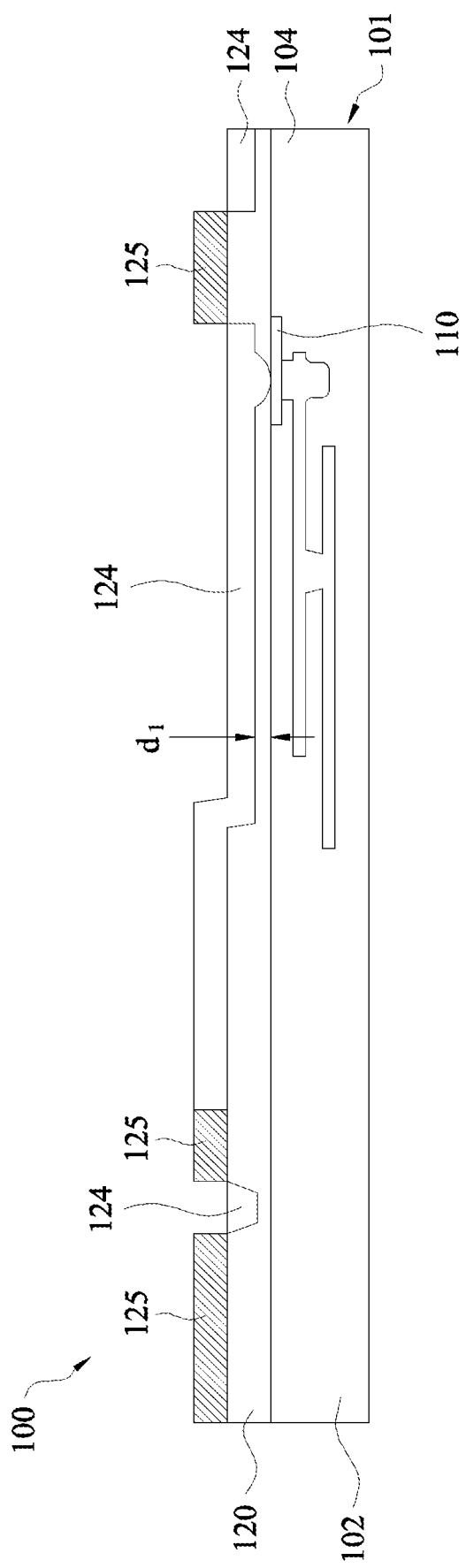
Figure 12:
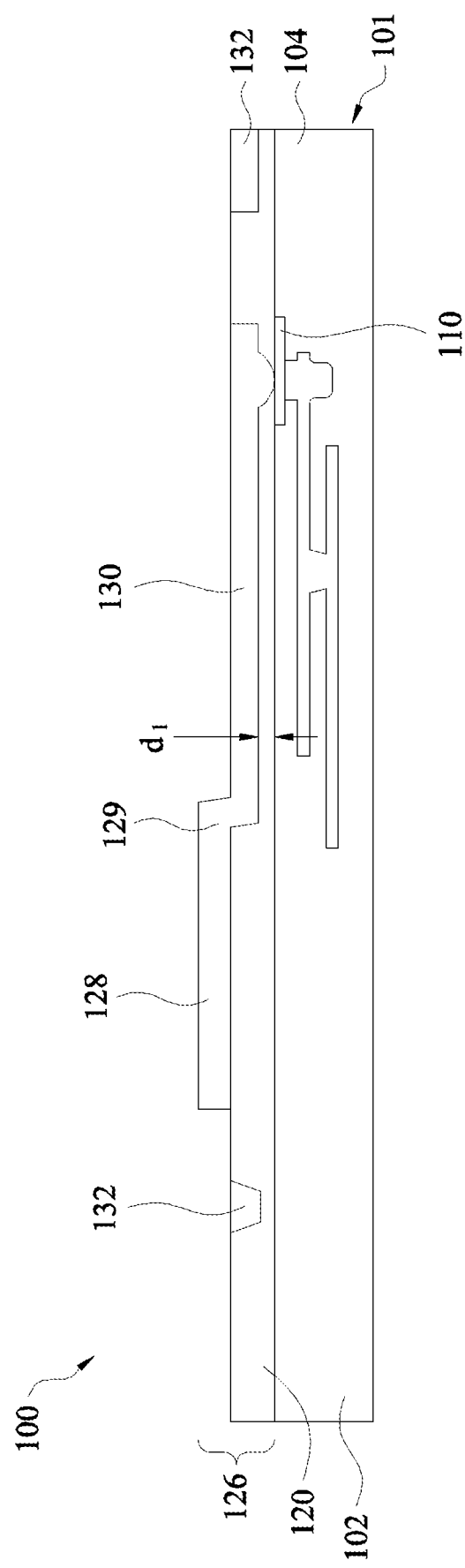
Figure 13:
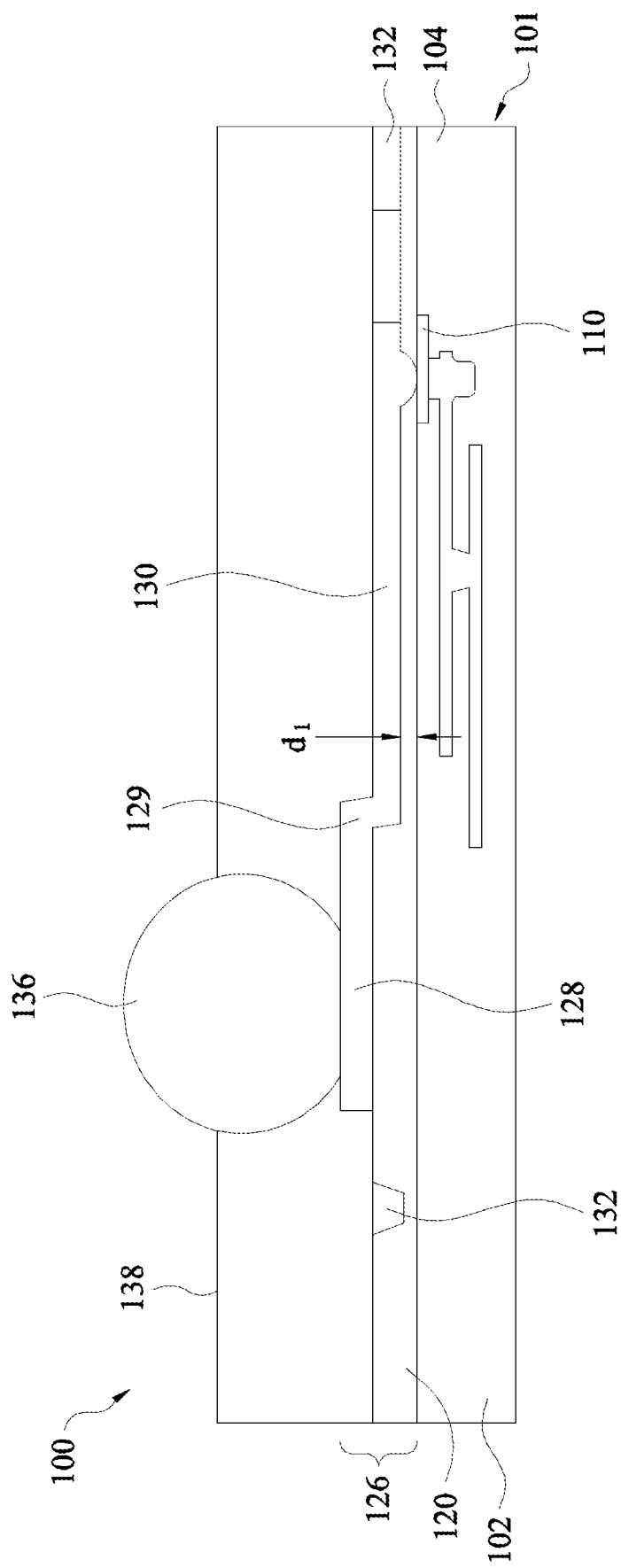

The conductive material 124 is then formed over the polymer material 120 and the exposed portion of the contact pad 110, as shown in FIGS. 11 and 12 and as described for the packaging process steps shown in FIGS. 5, 6, and 7. The connector 136 is formed on the PPI pad 128, and the molding material 138 is applied, as shown in FIG. 13, and as described for the packaging process step shown in FIGS. 8 and 9.

Thus, in the embodiments shown in FIGS. 10 through 13, a portion of the polymer material 120 is left remaining beneath the PPI line 130. A portion of the polymer material 120 is disposed beneath the PPI line 130, for example. In some of the embodiments shown in FIGS. 10 through 13, the polymer material 120 comprises a first thickness, and the PPI line 130 comprises a second thickness, wherein the second thickness is less than the first thickness. In some embodiments, the second thickness of the PPI line 130 comprises about 50% to about 90% of the first thickness of the polymer material 120. The PPI line 130 comprises a sufficient thickness so that the top surface of the PPI line 130 is substantially coplanar with or lower than the top surface of the polymer material 120 in some embodiments, to prevent dendrite growth of the material of the PPI line 130 in a lateral direction within the molding material 138 to adjacent PPI lines 130 and/or 132 in some embodiments, for example.

In some embodiments, the polymer material 120 illustrated in FIGS. 3 through 13 comprises a first polymer material 120a, as shown in FIGS. 14 through 19, and an additional polymer material is included in the packaged semiconductor device. For example, a second polymer material 120b is disposed over the first polymer material 120a in the embodiments shown in FIGS. 14 through 19. The second polymer material 120b is also disposed over the PPI line 130 and a portion of the PPI pad 128.

Figure 14:
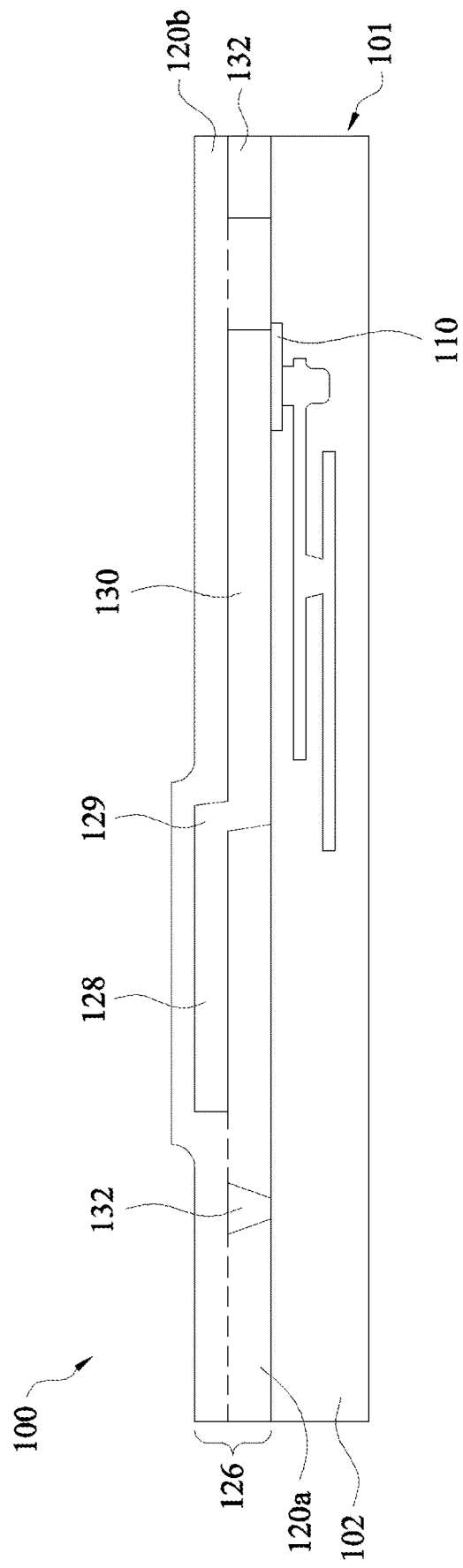
FIGS. 14 through 16 are cross-sectional views that illustrate a method of packaging a semiconductor device at various stages in accordance with some embodiments.
Figure 15:
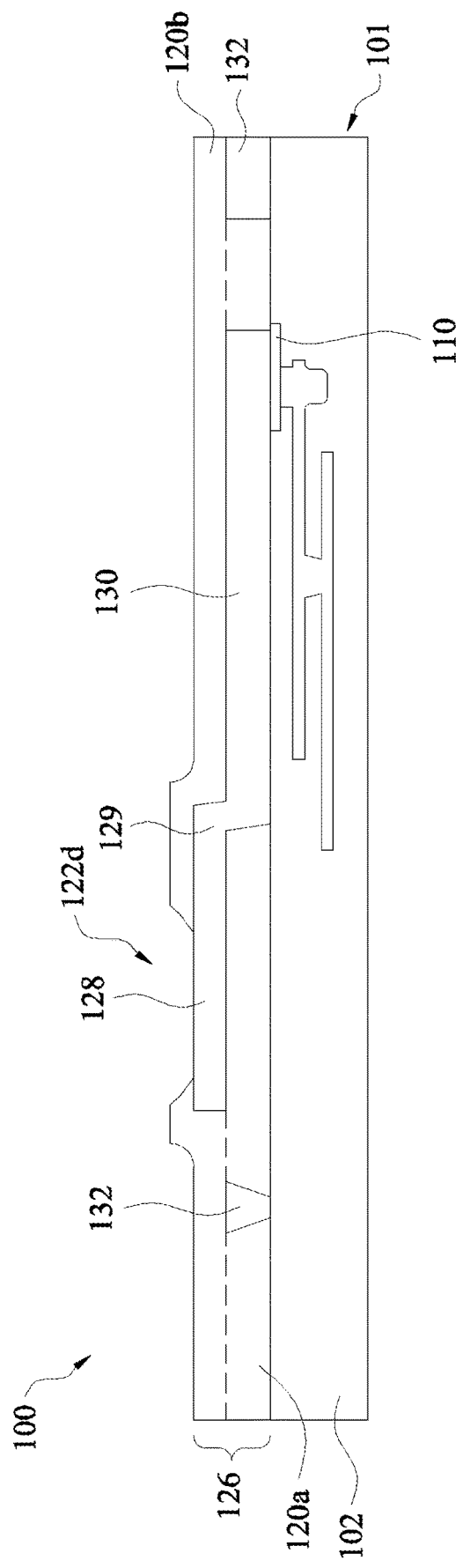
Figure 16:
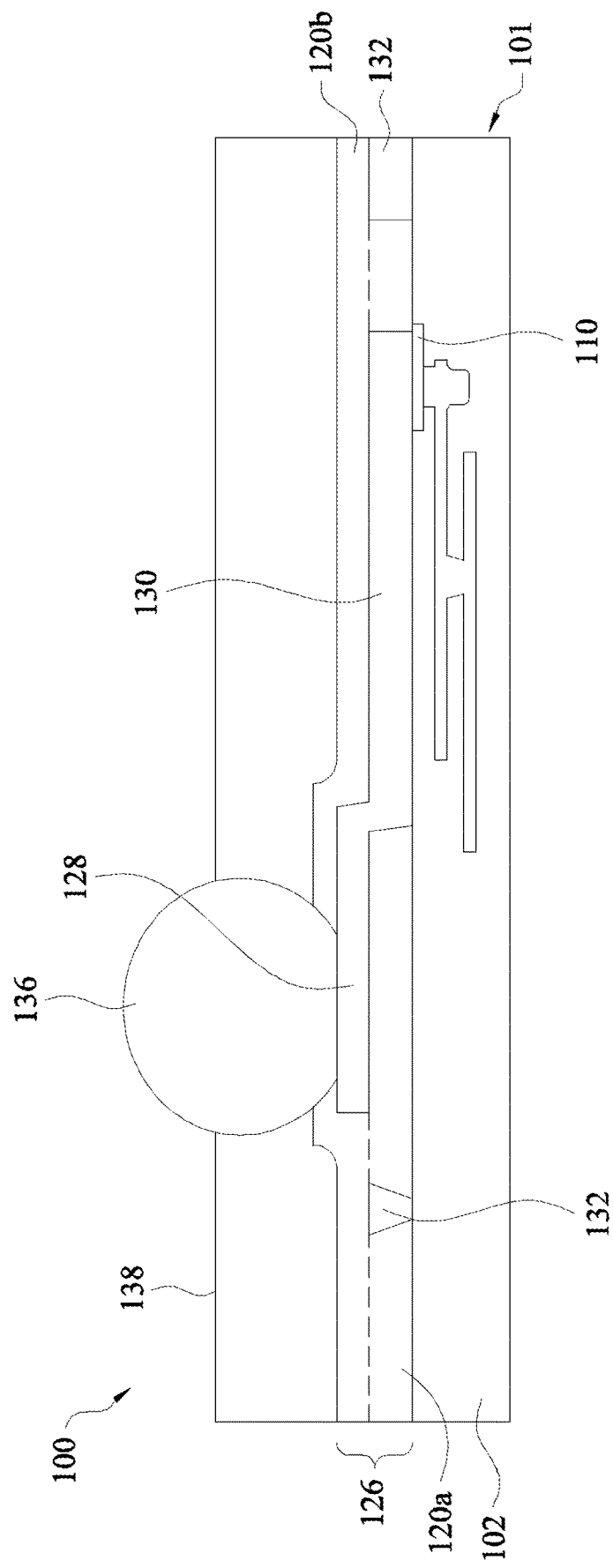

FIGS. 14 through 16 are cross-sectional views that illustrate a method of packaging a semiconductor device at various stages in accordance with some embodiments, wherein after the packaging process step shown in FIGS. 6 and 7, a second polymer material 120b is formed over the first polymer material 120a and top surfaces of the PPI pad 128, the transition element 129, the PPI line 130, and the conductive traces or additional PPI lines 132, as shown in FIG. 14. The second polymer material 120b may comprise similar materials, dimensions, and formation methods as described for the first polymer material 120a, (e.g., polymer material 120 shown in FIGS. 3 through 13). An opening 122d is formed in the second polymer material 120b using a lithography process or laser drilling process, as shown in FIG. 15. The second polymer material 120b may be left remaining on edge portions of the PPI pad 128, for example. The opening 122d is formed over the PPI pad 128 so a connector 136 may be attached to the PPI pad 128, as shown in FIG. 16 and as described for FIG. 8. The molding material 138 is then formed around the connector 136 and over the second polymer material 120b, also as described for FIG. 8, and as shown in FIG. 16.

The second polymer material 120b advantageously provides additional protection and isolation for the PPI lines 130 and other conductive features of the interconnect structure 126, such as the conductive traces or additional PPI lines 132 and the transition element 129.

Figure 17:
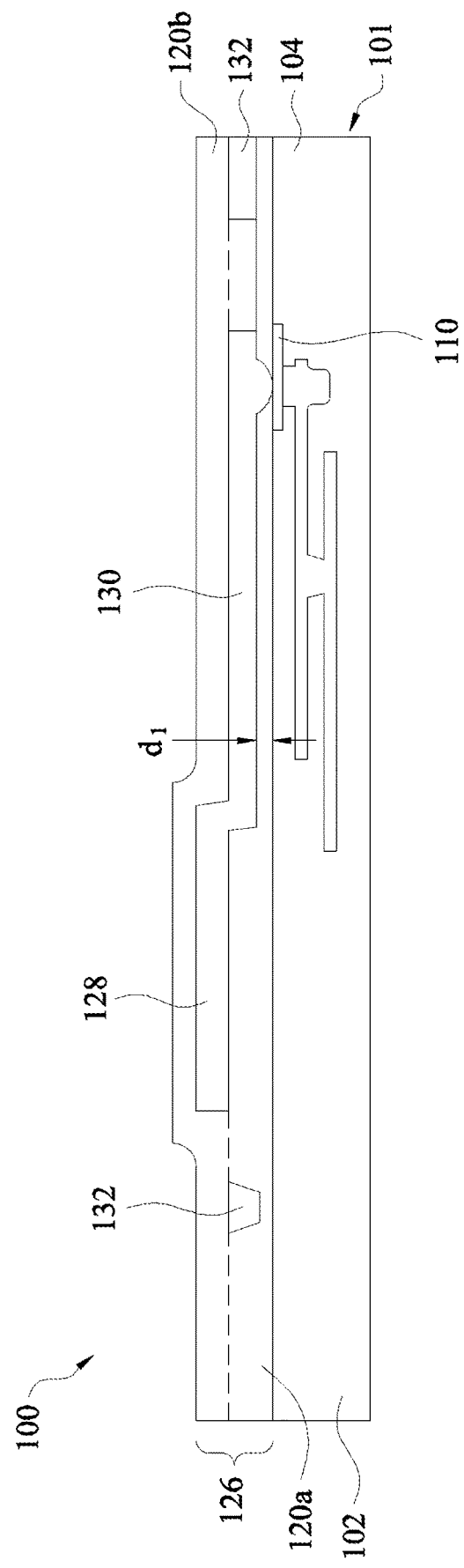
FIGS. 17 through 19 are cross-sectional views that illustrate a method of packaging a semiconductor device at various stages in accordance with some embodiments.
Figure 18:
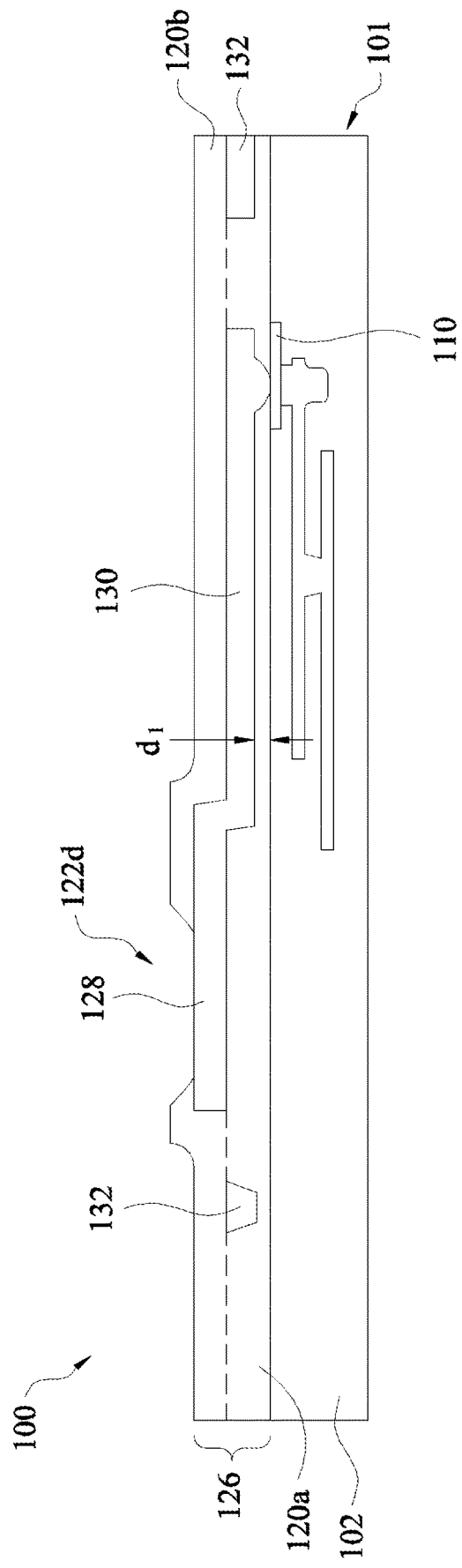
Figure 19:
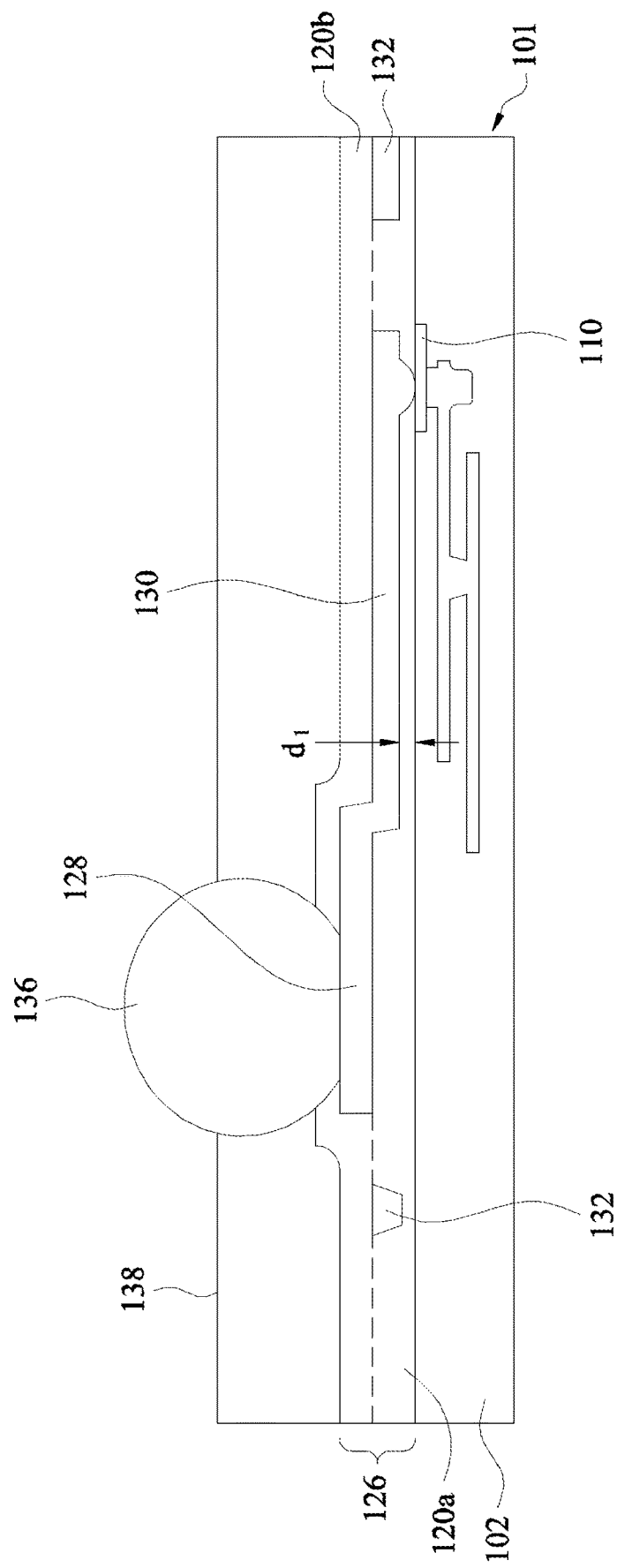

FIGS. 17 through 19 are cross-sectional views that illustrate a method of packaging a semiconductor device at various stages in accordance with some embodiments. The embodiments illustrated in FIGS. 10 through 12 are implemented, wherein an upper region of the first polymer material 120a is removed, and the PPI line 130 is formed over a lower region of the first polymer material 120a, as shown in FIG. 17. Thus, a portion of the first polymer material 120a is disposed beneath the PPI line 130. A second polymer material 120b is also included in the packaged semiconductor device, wherein the second polymer material 120b is disposed over the first polymer material 120a, as shown and described for FIGS. 14 through 16, and as illustrated in FIGS. 17 through 19.

Figure 20:
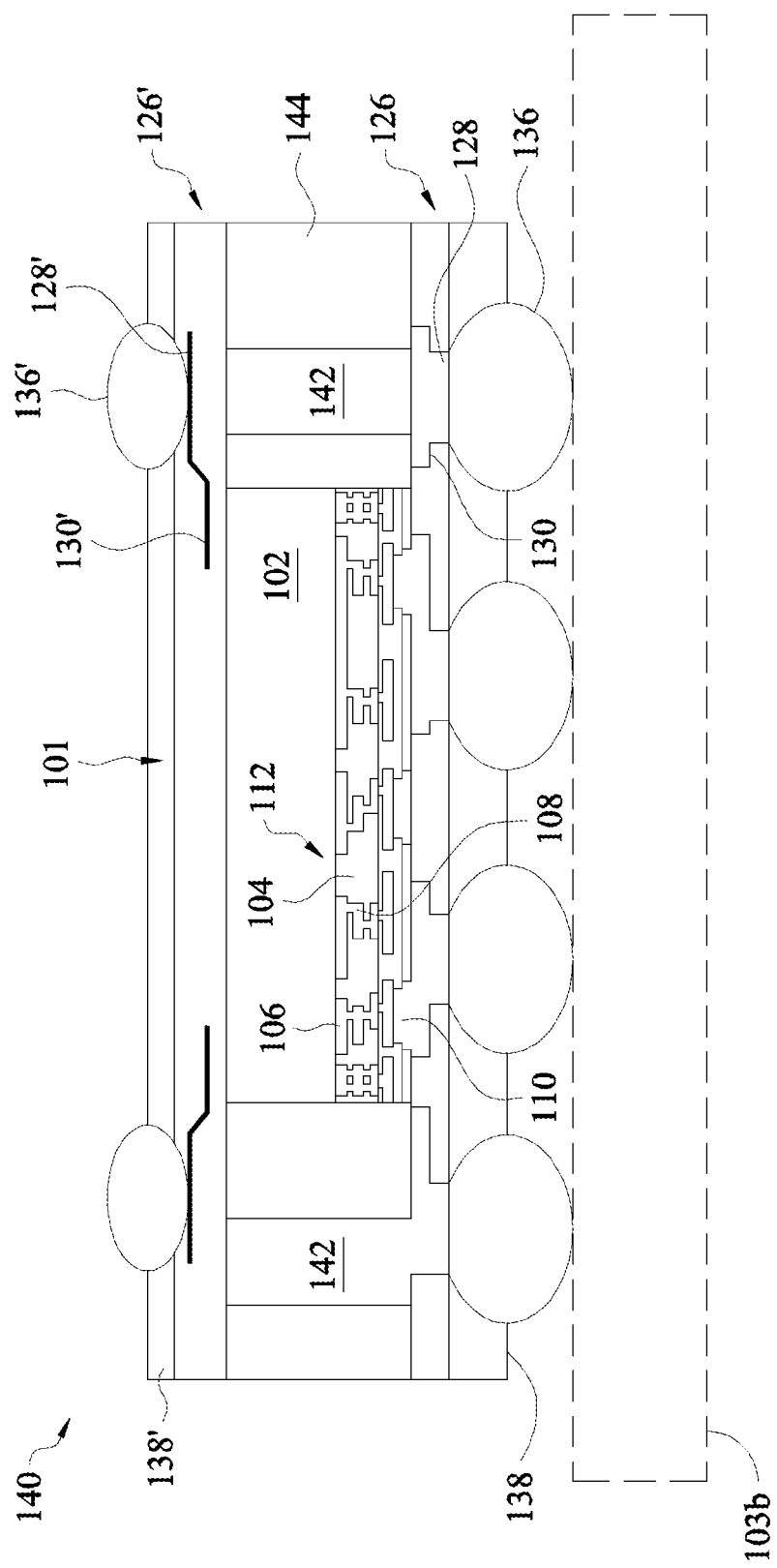
FIG. 20 is a cross-sectional view of a packaged semiconductor device in accordance with some embodiments.

FIG. 20 is a cross-sectional view of a packaged semiconductor device 140 in accordance with some embodiments that may include the portions 100 of the packaged semiconductor devices shown in and described with reference to FIGS. 1 through 19 herein. The portions 100 of the packaged semiconductor devices described with reference to FIGS. 1 through 19 are inverted in the view shown in FIG. 20. Additional elements and features of the packaged semiconductor device 140 are also shown.

The integrated circuit die 101 comprises a first side comprising a bottom side in FIG. 20. The integrated circuit die 101 also comprises a second side opposite the first side, wherein the second side comprises a top side in FIG. 20. The polymer material 120 or polymer materials 120a and 120b, the PPI pad 128, and the PPI line 130 shown and described for the embodiments illustrated in FIGS. 1 through 19 comprise a first interconnect structure 126 disposed proximate the first side of the integrated circuit die 101. The packaged semiconductor device 140 further includes a second interconnect structure 126' disposed proximate the second side of the integrated circuit die 101. In some embodiments, the second interconnect structure 126' may (or may not) include the PPI pads 128 and PPI lines 130 described herein, as shown at 128' and 130', respectively. Likewise, connectors 136 may (or may not) be coupled to the PPI pads 128', as shown at 136', and a molding material 138 may (or may not) be formed over the second interconnect structure 126' and around the connectors 136', as shown at 138'. In other embodiments, only the second interconnect structure 126' includes the PPI pads 128', PPI lines 130', connectors 136', and molding material 138' described herein. Thus, either the first interconnect structure 126, the second interconnect structure 126', or both the first interconnect structure 126 and the second interconnect structure 126' may include the PPI lines 130 or 130' embedded in a polymer material 120 or 120a, in accordance with some embodiments of the present disclosure.

To package the semiconductor device which comprises an integrated circuit die 101 in some embodiments, first, a carrier 103a is provided as shown in phantom in FIG. 1. A plurality of through-vias 142 may be formed over the carrier 103a by plating, photolithography, or other methods, before or after a plurality of integrated circuit dies 101 is coupled to the carrier 103a. The plurality of through-vias 142 may be formed using an electro-plating process, by depositing a seed layer (not shown) over the carrier 103a, and forming a patterned mask (also not shown) with a desired pattern for the through-vias 142 over the seed layer. The through-vias 142 are plated onto the carrier 103a through the patterned mask, and the patterned mask is then removed. The exposed portions of the seed layer are also removed. The through-vias 142 may comprise copper, a copper alloy, or other metals or conductive materials. Dozens or hundreds of through-vias 142 may be included in a package for each of the integrated circuit dies 101 or groups of integrated circuit dies 101 that are packaged together, for example. The plurality of through-vias 142 provides electric connections in a vertical direction for the packaged semiconductor devices 140 in some embodiments. Each of the plurality of through-vias 142 may be positioned so that they will be coupled to a conductive portion of the interconnect structure 126 that will later be formed, for example.

A plurality of the integrated circuit dies 101 is coupled to the carrier 103a between some of the plurality of through-vias 142. Only one integrated circuit die 101 is shown in FIG. 20; in some embodiments, a plurality of integrated circuit dies 101 is coupled to the carrier 103a and is packaged simultaneously. The integrated circuit die 101 or two or more integrated circuit dies 101 are later singulated along scribe lines to form a plurality of packaged semiconductor devices 140. The plurality of integrated circuit dies 101 is coupled to the carrier 103a using a die attach film (DAF) disposed on a bottom surface of the integrated circuit dies 101. The plurality of integrated circuit dies 101 may comprise logic devices, processors, or other devices, as examples. The integrated circuit dies 101 are formed on a wafer (not shown), and the integrated circuit dies 101 are singulated along scribe lines to form the plurality of integrated circuit dies 101 in some embodiments. The plurality of integrated circuit dies 101 may be placed on the carrier 103a using a pick-and-place machine or manually, for example.

A molding material 144 is disposed over the carrier 103a, the plurality of integrated circuit dies 101, and the plurality of through-vias 142. The molding material 144 is disposed between the through-vias 142 and integrated circuit dies 101, between adjacent ones of the plurality of through-vias 142, and/or between adjacent ones of the plurality of integrated circuit dies 101, in some embodiments wherein two or more integrated circuit dies 101 are packaged together. The molding material 144 may comprise similar materials and application methods as described for molding material 138, for example. In some embodiments, as deposited, the molding material 144 extends over top surfaces of the plurality of integrated circuit dies 101 and the plurality of through-vias 142, and after the molding material 144 is applied, a top portion of the molding material 144 is removed using a planarization process, such as a CMP process, a grinding process, an etch process, or combinations thereof, as examples. Other methods may also be used to planarize the molding material 144. A top portion of the integrated circuit dies 101 and/or through-vias 142 may also be removed during the planarization process for the molding material 144.

The interconnect structure 126 described herein is then formed over the molding material 144, the through-vias 142, and the integrated circuit dies 101. The connectors 136 are coupled to the PPI pads 128 of the interconnect structure 126, and the molding material 138 is applied, as previously described herein. A second carrier 103b, shown in phantom in FIG. 20, which may comprise a wafer or a carrier tape in some embodiments is then coupled to the connectors 136, and the first carrier 103a shown in FIG. 1 is removed. The packaged semiconductor device 140 is then inverted, also shown in FIG. 20.

The second interconnect structure 126' is then formed over the bottom surface of the integrated circuit die 101, the molding material 144, and the through-vias 142. Connectors 136' are coupled to the interconnect structure 126', and a molding material 138' is formed around the connectors 136' over the second interconnect structure 136'. The second carrier 103b is then removed. The second interconnect structure 126' provides electrical connections in a horizontal direction for a plurality of packaged semiconductor devices 140 in some embodiments, for example. The second interconnect structure 126' comprises back-side routing, and the first interconnect structure 126 comprises front-side routing, e.g., relative to the integrated circuit die 101, for the packaged semiconductor devices 140 in some embodiments.

Only one packaged semiconductor device 140 is shown disposed over the second carrier 103b in FIG. 20; however, dozens, hundreds, or more packaged semiconductor devices 140 may be simultaneously formed over the second carrier 103b in an array of rows and columns. Each of the packaged semiconductor devices 140 comprises an integrated circuit die 101 or a plurality of integrated circuit dies 101. For example, two or more integrated circuit dies 101 may be packaged together in a single packaged semiconductor device 140.

In some embodiments, the plurality of packaged semiconductor devices 140 is singulated along scribe lines to form a plurality of separated packaged semiconductor devices 140. The packaged semiconductor devices 140 may be singulated using a saw (not shown), which may include a blade comprising diamond or other materials in some embodiments, for example.

In some embodiments, the plurality of connectors 136 or 136' is not included on the packaged semiconductor device 140. In other embodiments, only a first interconnect structure 126 or a second interconnect structure 126' that includes the PPI lines 130 or 130' embedded within a polymer material 120 or 120a is included on the packaged semiconductor device 140.

The method of packaging semiconductor devices using the carriers 103a and/or 103b is merely an example: the integrated circuit dies 101 may be packaged using different methods or orders of a packaging process. For example, only the first carrier 103a shown in FIG. 1 in phantom may be used, and the second interconnect structure 126' may be formed on the first carrier 103a before the packaging process step shown in FIG. 1. The through-vias 142 may be formed over the second interconnect structure 126', the integrated circuit dies 101 may be attached to the second interconnect structure 126', and the molding material 144 may then be applied. The molding material 144 is planarized, and the packaging process steps shown in FIGS. 2 through 19 may then be performed. The first carrier 103a is then removed, and the connectors 136' and molding material 138' may be formed over the second interconnect structure 126'.

As yet another example, the first interconnect structure 126 may first be formed over a first carrier 103a, the through-vias 142 and integrated circuit dies 101 may be formed over the first interconnect structure 126, and the molding material 144 may then be applied. The second interconnect structure 126' may then be formed over the molding material 144, through-vias 142, and integrated circuit dies 101. Connectors 136' and molding material 138' may or may not be formed on the second interconnect structure 126', and the first carrier 103a is removed. Connectors 136 and molding material 138 may or may not be formed on the first interconnect structure 126.

The packaging process flow for packaging integrated circuit dies 101 and forming packaged semiconductor devices 140 may also comprise other processing steps and orders of the processing steps.

The packaged semiconductor devices 140 comprise fan-out structures in some embodiments. For example, the conductive wiring is spaced apart farther in the first and/or second interconnect structures 126 and 126' than conductive wiring of the integrated circuit die 101 is spaced. Likewise, the footprint of contact pads in or on the first and second interconnect structures 126 and 126' is larger than the footprint of contacts 110 of the integrated circuit die 101.

Thus, in accordance with some embodiments of the present disclosure, for example, forming the molding material 138 comprises forming a first molding material; and in some embodiments, forming the polymer material 120 or 120a, forming the opening 122b, forming the conductive material 124, and patterning the conductive material 124 comprise forming a first interconnect structure 126. A packaging method further comprises forming a plurality of through-vias 142 proximate the integrated circuit die 101, and forming a second molding material 144 around the integrated circuit die 101 and the plurality of through-vias 142. The packaging method further comprises forming a second interconnect structure 126' over or on the integrated circuit die 101, the second molding material 144, and the plurality of through-vias 142. The second molding material 144 is disposed between the first interconnect structure 126 and the second interconnect structure 126', for example.

Figure 21:
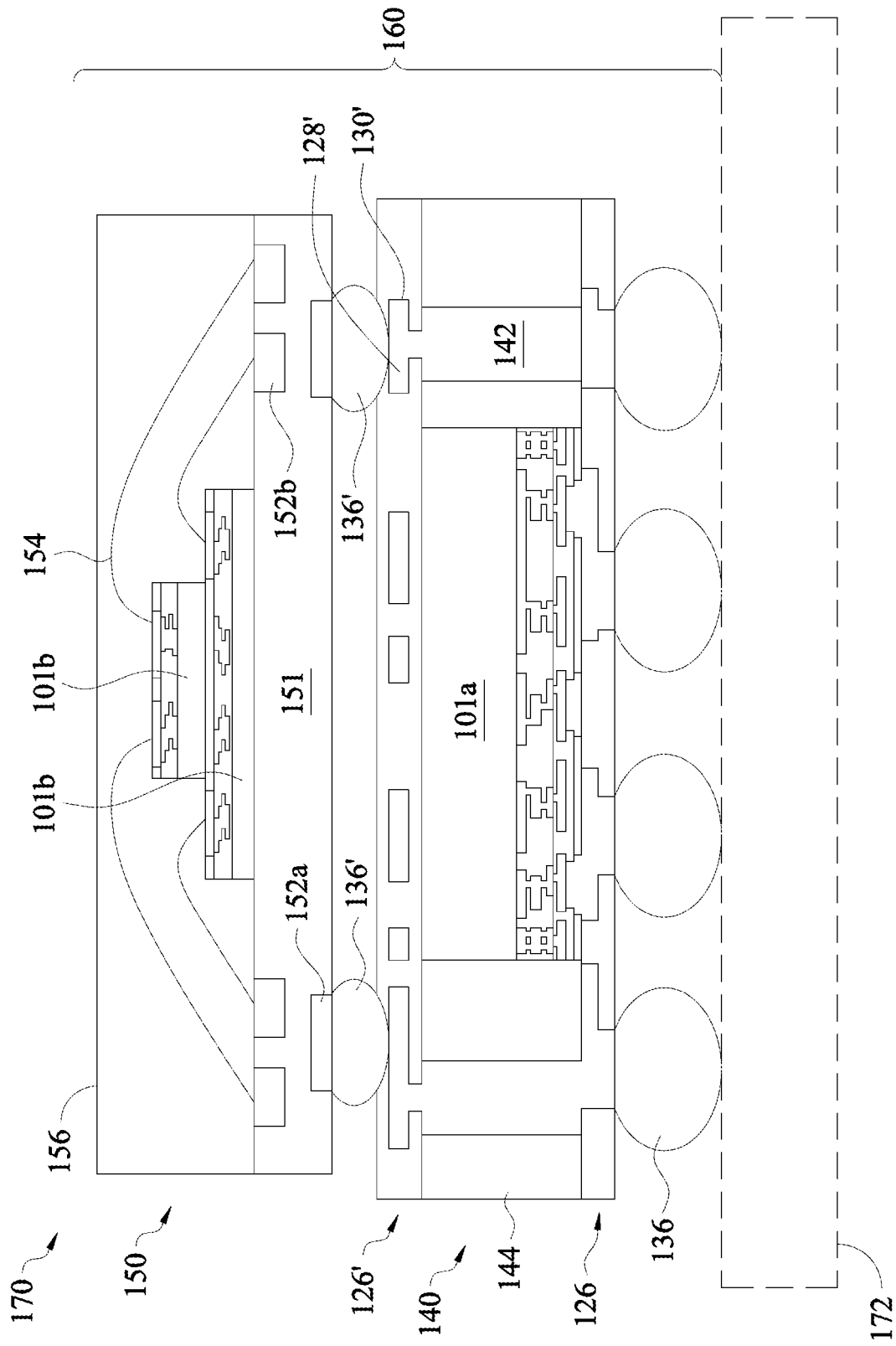
FIG. 21 is a cross-sectional view of a package-on-package (POP) device in accordance with some embodiments.

FIG. 21 is a cross-sectional view of a package-on-package (POP) device 170 in accordance with some embodiments. A packaged integrated circuit may be coupled to the first interconnect structure 126 or the second interconnect structure 126' of the packaged semiconductor device 140 shown in FIG. 21 to form a POP device 170, for example. In FIG. 21, the packaged semiconductor devices 140 comprise first packaged semiconductor devices that each include an integrated circuit die 101a. Each first packaged semiconductor device 140 is packaged with a second packaged semiconductor device 150 to form POP devices 170. The second packaged semiconductor devices 150 are also referred to herein as packaged integrated circuits (ICs), for example. Before the packaged semiconductor devices 140 are singulated, and after the second interconnect structure 126' is formed, a plurality of the second packaged semiconductor devices 150 is provided, and each of the plurality of second packaged semiconductor devices 150 is coupled to one of the first packaged semiconductor devices 140 using the connectors 136' coupled to the second interconnect structure 126' of the first packaged semiconductor devices 140, coupled to the second packaged semiconductor devices 150, or coupled to both the first packaged semiconductor devices 140 and the second packaged semiconductor devices 150. The plurality of second packaged semiconductor devices 150 is coupled to the unsingulated plurality of first packaged semiconductor devices 140 by a method such as manually by an operator or technician, the use of an automated machine such as a pick-and-place machine, or other methods. The plurality of first packaged semiconductor devices 140 is then singulated to form the POP devices 170.

Each of the plurality of second packaged semiconductor devices 150 may comprise a substrate 151 that includes a plurality of contact pads 152a and 152b disposed on. The substrate 151 may include one or more interconnect structures (not shown) formed thereon that provide horizontal connections for the plurality of second packaged semiconductor devices 150 in some embodiments. The substrate 151 may also include a plurality of through-vias (also not shown) formed therein. One or more integrated circuit dies 101b may be coupled to a top surface of the substrate 151. Each of the plurality of second packaged semiconductor devices 150 comprises two vertically stacked integrated circuit dies 101b in the embodiments shown in FIG. 21, for example. Two or more integrated circuit dies 101b may also be packaged together horizontally in the second packaged semiconductor devices 150 in some embodiments, not shown.

In the embodiments shown, the integrated circuit dies 101b are coupled to contact pads 152b disposed on a top surface of the substrate 151 by bond wires 154. The bond wires 154 and through-vias in the substrate 151 provide vertical electrical connections for the plurality of second packaged semiconductor devices 150 in some embodiments. A molding material 156 is disposed over the integrated circuit dies 101b, the bond wires 154, and the substrate 151. The molding material 156 may comprise similar materials as described for the molding material 138 of the plurality of first packaged semiconductor devices 138, for example.

In some embodiments, the integrated circuit die or dies 101b comprise DRAM devices, for example. The integrated circuit dies 101b may also comprise other types of devices. One or more integrated circuit dies 101b may be included in the second packaged semiconductor devices 150. The integrated circuit dies 101b may be packaged together vertically as shown, or horizontally. The integrated circuit dies 101b may be packaged in a wire bond type of package as shown in FIG. 21, or the integrated circuit dies 101b may be packaged in other types of packages and using other types of packaging techniques.

A plurality of connectors 136', such as a eutectic material, is coupled to the bottom surface of the substrate 151 of the second packaged semiconductor devices 150 in some embodiments. The plurality of connectors 136' may be coupled to contact pads 152a disposed on a bottom surface of the substrate 151, for example. In some embodiments, the plurality of second packaged semiconductor devices 150 does not include the plurality of connectors 136', e.g., in embodiments wherein the plurality of first packaged semiconductor devices 140 includes the plurality of connectors 136' disposed on the top surface thereof. In other embodiments, a plurality of connectors 136' are included on both the first packaged semiconductor devices 140 and the second packaged semiconductor devices 150.

After the second packaged semiconductor devices 150 are coupled to the first packaged semiconductor devices 140 using the plurality of connectors 136', as shown in FIG. 21, a eutectic material of the connectors 136' is then reflowed, which mechanically and electrically couples the second packaged semiconductor devices 150 to the first packaged semiconductor devices 140. Each of the plurality of second packaged semiconductor devices 150 is coupled to one of the plurality of first packaged semiconductor devices 140 using some of the plurality of connectors 136', for example. The plurality of first packaged semiconductor devices 140 and the plurality of second packaged semiconductor devices 150 are arranged in an array of rows and columns in some embodiments. A plurality of scribe lines is disposed in an x direction and y direction between the plurality of first packaged semiconductor devices 140 and the plurality of second packaged semiconductor devices 150. The POP devices 170 are then singulated along the scribe lines.

The POP devices 170 may then be coupled to another device or object using the plurality of connectors 136 disposed on the bottom surfaces of the POP devices 170, e.g., using a surface mount technology (SMT) process. In some embodiments, the POP devices 170 may be coupled to a substrate 172, shown in phantom in FIG. 21, to form a chip-on-wafer-on-substrate (CoWoS) device. The POP devices 170 include the packaged semiconductor devices 140 that include the PPI lines 130 formed and embedded in the polymer material 120 or 120a described herein.

Figure 22:
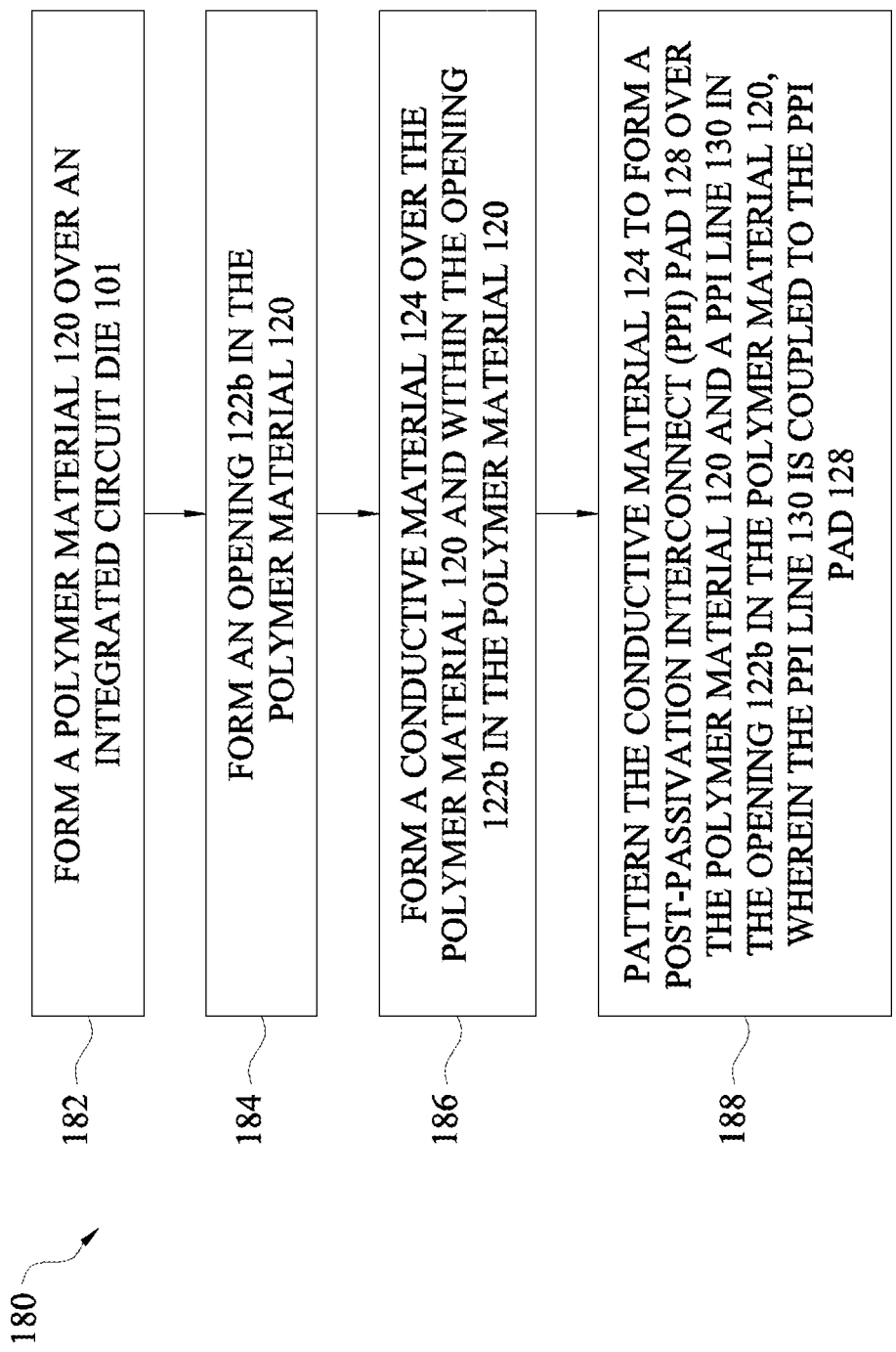
FIG. 22 is a flow chart of a method of packaging a semiconductor device in accordance with some embodiments of the present disclosure.

FIG. 22 is a flow chart 180 of a method of packaging a semiconductor device in accordance with some embodiments of the present disclosure. In step 182, a polymer material 120 is formed over an integrated circuit die 101, as shown in FIG. 2. In step 184, an opening 122b is formed in the polymer material 120, as shown in FIG. 3. In step 186, a conductive material 124 is formed over the polymer material 120 and within the opening in the polymer material 120, as shown in FIG. 5. In step 188, the conductive material 124 is patterned to form a PPI pad 128 over the polymer material 120 and a PPI line 130 in the opening 122b in the polymer material 120, wherein the PPI line 130 is coupled to the PPI pad 128, as shown in FIGS. 6 and 7. In some embodiments, the conductive material 124 is patterned as-deposited using a plating process, for example. In other embodiments, the conductive material 124 may be patterned using a lithography process.

Some embodiments of the present disclosure are advantageously implementable in and are particularly beneficial when used in POP devices, in some applications. The packaged semiconductor devices may comprise POP devices 170, system-on-a chip (SOC) devices, chip-on-wafer-on-substrate (CoWoS) devices, or other types of 3DICs in some embodiments, as examples. Embodiments of the present disclosure are also beneficial for and may be implemented in other types of devices that include interconnect structures and fan-out structures, as other examples.

In some embodiments, the integrated circuit dies 101 comprise first integrated circuit dies 101a that comprise logic devices or processors and the first packaged semiconductor devices 140 comprise fan-out wiring, and the second integrated circuit dies 101b of the second packaged semiconductor devices 150 comprise memory devices such as DRAM devices, e.g., in some embodiments wherein the PPI lines 130 formed within the openings in the polymer material 120 and 120a described herein are implemented in an integration fan-out (InFO) POP device 170. In some embodiments, the second packaged semiconductor devices 150 include a plurality of stacked integrated circuit dies 101b comprising DRAM devices, for example. The first integrated circuit dies 101a, the second integrated circuit dies 101b, the first packaged semiconductor devices 140, and the second packaged semiconductor devices 150 may also comprise other types of devices, and the recovery materials and processes described herein may be implemented in other types of applications.

Some embodiments of the present disclosure include packaged semiconductor devices 140 and POP devices 170 that include the PPI lines 130 formed in the polymer material 120 or 120a. Some embodiments include interconnect structures 126 and packaged semiconductor devices 140 that include the PPI lines 130 formed in the polymer material 120 or 120a. Other embodiments include methods of packaging semiconductor devices.

Advantages of some embodiments of the present disclosure include providing packaging methods for wafer-level packages (WLPs), POP devices, other types of 3DICs, and other types of packages that include PPI lines that are embedded within polymer materials. The PPI lines formed within the polymer materials prevent dendrite growth laterally, preventing shorts of adjacent PPI lines and thus improving yields. This is particularly advantageous in applications where testing of the packaged devices involves exposure to relatively high temperatures and moist environments. Reliability performance of packaged semiconductor devices during PCT is enhanced in some embodiments, for example. Some embodiments are implementable without requiring additional processing steps or costs. Furthermore, the packaging methods and structures described herein are easily implementable into existing packaging process flows and structures.

In some embodiments, an interconnect structure includes a polymer material, a PPI pad disposed over the polymer material, and a PPI line disposed within an opening in the polymer material, wherein the PPI line is coupled to the PPI pad.

In other embodiments, a packaged semiconductor device includes an integrated circuit die, a polymer material disposed over the integrated circuit die, and a PPI pad disposed over the polymer material. A PPI line is disposed within an opening in the polymer material. The PPI line is coupled to the PPI pad. A molding material disposed is over the PPI line and the polymer material.

In yet other embodiments, a method of packaging a semiconductor device includes forming a polymer material over an integrated circuit die, forming an opening in the polymer material, and forming a conductive material over the polymer material and within the opening in the polymer material. The method includes patterning the conductive material to form a PPI pad over the polymer material and a PPI line in the opening in the polymer material, the PPI line being coupled to the PPI pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging a semiconductor device, the method comprising:
   forming a polymer material over an integrated circuit die;
   forming an opening in the polymer material;
   forming a conductive material over the polymer material and within the opening in the polymer material;
   patterning the conductive material to form a post-passivation interconnect (PPI) pad over the polymer material and a PPI line in the opening in the polymer material, wherein the PPI line is coupled to the PPI pad through a transition element, wherein a bottommost surface of the PPI pad is disposed above a topmost surface of the polymer material, and wherein a topmost surface of the PPI line is disposed below the topmost surface of the polymer material, wherein the PPI line comprises a first tapered sidewall extending from a bottommost surface of the PPI line, and wherein the PPI line comprises a horizontal surface extending from the first tapered sidewall to a second tapered sidewall of the transition element;
   forming a connector on the PPI pad, the connector being coupled to the PPI pad; and
   encapsulating the connector with a molding material, the molding material extending over the PPI pad, the PPI line, and the polymer material.

2. The method according to claim 1, wherein forming the opening in the polymer material comprises forming the opening in an upper region of the polymer material or forming the opening in an entire thickness of the polymer material.

3. The method according to claim 1, wherein forming the polymer material comprises forming a material selected from a group consisting essentially of: polybenzoxazole (PBO), polyimide (PI), epoxy, benzocyclobutene (BCB), molding compound, and combinations thereof.

4. The method according to claim 1, wherein the polymer material comprises a first porosity, wherein the molding material comprises a second porosity, and wherein the second porosity is greater than the first porosity.

5. The method according to claim 1, further comprising forming a passivation layer over the integrated circuit die, wherein the polymer material is formed over the passivation layer.

6. A method comprising:
   forming an interconnect structure over a substrate, forming the interconnect structure comprising:
      depositing a first polymer layer over the substrate;
      patterning the first polymer layer to form an opening exposing a contact pad in the substrate, wherein patterning the first polymer layer to form the opening comprises patterning the first polymer layer to form a first opening extending partially through the first polymer layer and patterning the first polymer layer to form a second opening, the second opening exposing the contact pad in the substrate, the first opening having a fourth width greater than a fifth width of the second opening; and
      depositing a conductive line in the opening and over the first polymer layer, the conductive line comprising a PPI line having an uppermost surface disposed below an uppermost surface of the first polymer layer, a PPI pad disposed above the uppermost surface of the first polymer layer, and a transition structure coupling the PPI line to the PPI pad, wherein the PPI line extends along a first horizontal surface of the first polymer layer, and wherein the PPI pad extends along a second horizontal surface of the first polymer layer disposed above the first horizontal surface of the first polymer layer.

7. The method of claim 6, wherein a thickness of a portion of the first polymer layer disposed between the first opening and the substrate is from 3 µm to 20 µm.

8. The method of claim 6, further comprising:
   forming a conductive connector over and coupled with the conductive line; and
   forming a molding compound over the conductive line and the first polymer layer, the molding compound surrounding the conductive connector.

9. The method of claim 8, wherein the conductive line is deposited with a thickness less than a height of the opening, and wherein the molding compound extends below the uppermost surface of the first polymer layer.

10. The method of claim 8, wherein the molding compound has a porosity greater than a porosity of the first polymer layer.

11. A method comprising:
    depositing a polymer layer over an integrated circuit die;
    patterning the polymer layer with a first patterning process to form a first opening in the polymer layer, wherein portions of the polymer layer are interposed between a bottom surface of the first opening and the integrated circuit die after patterning the polymer layer with the first patterning process;
    after patterning the polymer layer with the first patterning process, patterning the polymer layer with a second patterning process different from the first patterning process to form a second opening in the polymer layer, the second opening exposing a contact pad of the integrated circuit die, the second opening having a width less than a width of the first opening;
    forming a conductive material in the first opening and the second opening, the conductive material extending along an uppermost surface of the polymer layer;
    forming a connector coupled to the conductive material; and
    encapsulating the connector with an encapsulant, the encapsulant extending over the conductive material and the polymer layer.

12. The method of claim 11, wherein the first patterning process comprises a lithography process and the second patterning process comprises a laser drilling process.

13. The method of claim 11, wherein patterning the polymer layer with the first patterning process comprises forming a first lithography mask over the polymer layer and wherein patterning the polymer layer with the second patterning process comprises forming a second lithography mask over the polymer layer and within the first opening.

14. The method of claim 11, wherein the first openings extend into the polymer layer a depth from 50 percent to 90 percent of a thickness of the polymer layer.

15. The method according to claim 1, wherein the conductive material is conformally formed over a tapered sidewall of the polymer material adjacent the opening.

16. The method of claim 6, wherein the transition structure comprises sidewalls extending from the PPI pad to the PPI line at an non-orthogonal angle to a major surface of the substrate in a cross-sectional view.

17. The method of claim 6, wherein after patterning the first polymer layer to form the opening, the first polymer layer comprises a tapered sidewall adjacent the opening, and wherein the conductive line is conformally deposited over the tapered sidewall.

18. The method of claim 11, wherein the first opening in the polymer layer comprises a first tapered sidewall and a first vertical sidewall opposite the first tapered sidewall in a cross-sectional view after patterning the polymer layer with the first patterning process.

19. The method of claim 18, wherein the conductive material extends along the first tapered sidewall of the polymer layer.

20. The method of claim 6, wherein the first opening has straight tapered sidewalls, and wherein the second opening has curved sidewalls.

\* \* \* \* \*